(12) United States Patent
Yasutake

(10) Patent No.: US 8,384,198 B2
(45) Date of Patent: Feb. 26, 2013

(54) RESISTANCE CHANGE MEMORY AND MANUFACTURING METHOD THEREOF

(75) Inventor: Nobuaki Yasutake, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 12/956,453

(22) Filed: Nov. 30, 2010

(65) Prior Publication Data

US 2011/0127484 A1    Jun. 2, 2011

(30) Foreign Application Priority Data

Dec. 1, 2009 (JP) ................ 2009-273788

(51) Int. Cl.
*H01L 29/66* (2006.01)
*H01L 21/425* (2006.01)

(52) U.S. Cl. ....................... 257/656; 438/534
(58) Field of Classification Search ................ 438/383, 438/534, 573, 605; 257/298, 656, E29.327–E29.333
See application file for complete search history.

(56) References Cited

U.S. PATENT DOCUMENTS

| | | | | |
|---|---|---|---|---|
| 7,718,546 B2 * | 5/2010 | Radigan et al. | ................ | 438/758 |
| 7,920,408 B2 * | 4/2011 | Azuma et al. | ................ | 365/148 |
| 8,053,776 B2 * | 11/2011 | Ohashi | ................ | 257/64 |

FOREIGN PATENT DOCUMENTS

| | | |
|---|---|---|
| JP | 7-335875 | 12/1995 |
| JP | 2008-182121 | 8/2008 |

* cited by examiner

*Primary Examiner* — Calvin Lee
(74) *Attorney, Agent, or Firm* — Oblon, Spivak, McClelland, Maier & Neustadt, L.L.P.

(57) ABSTRACT

According to one embodiment, a resistance change memory includes a first interconnect extending in a first direction, a second interconnect extending in a second direction intersecting with the first direction, and a cell unit which is provided between the first interconnect and the second interconnect. The cell unit includes a non-ohmic element and a memory element. The non-ohmic element includes a first silicon layer of an n-conductivity type and a conducting layer in contact with a first face of the first silicon layer. The memory element stores data according to a reversible change of a resistance state. The first silicon layer includes a first element and a second element as donor.

13 Claims, 17 Drawing Sheets

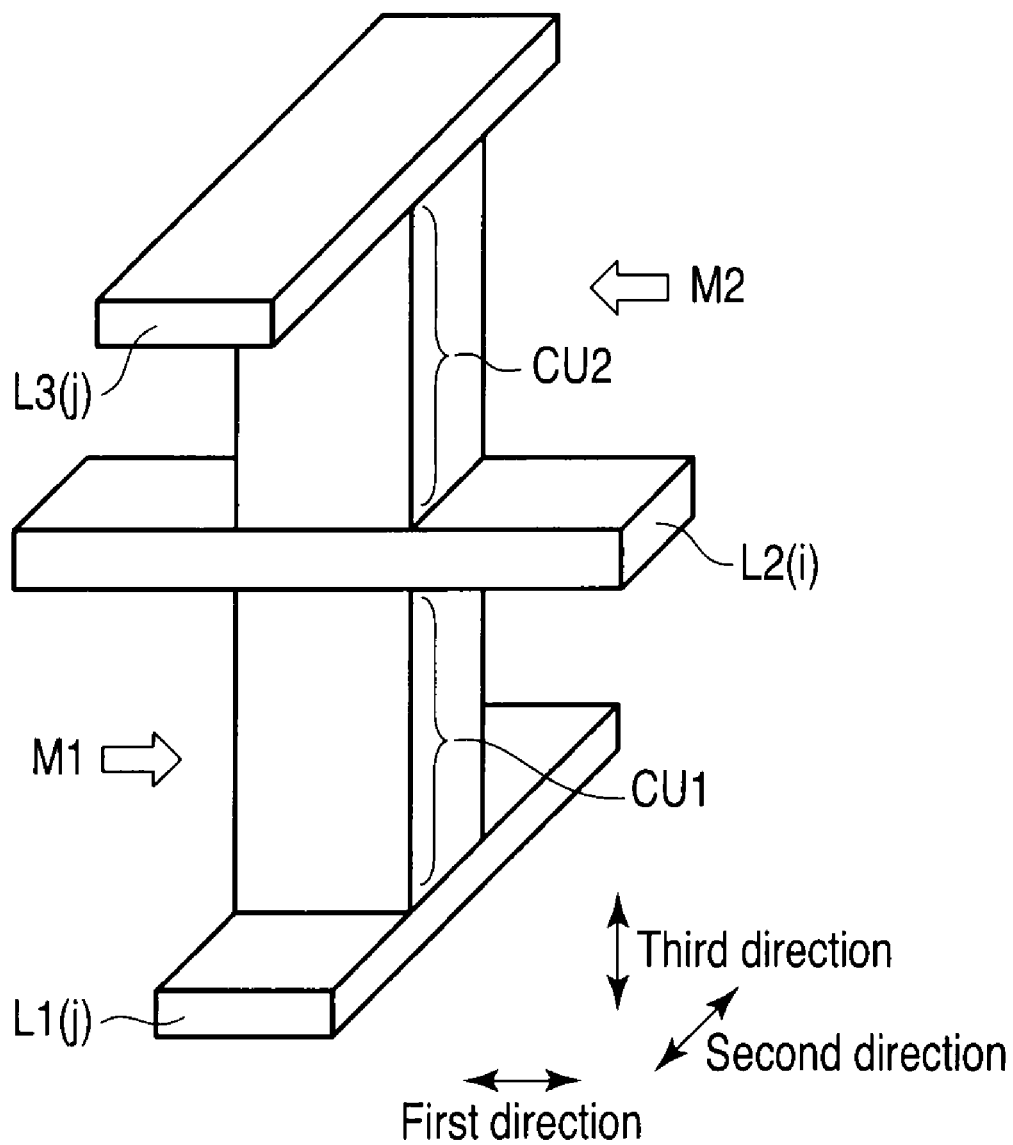
F I G. 3

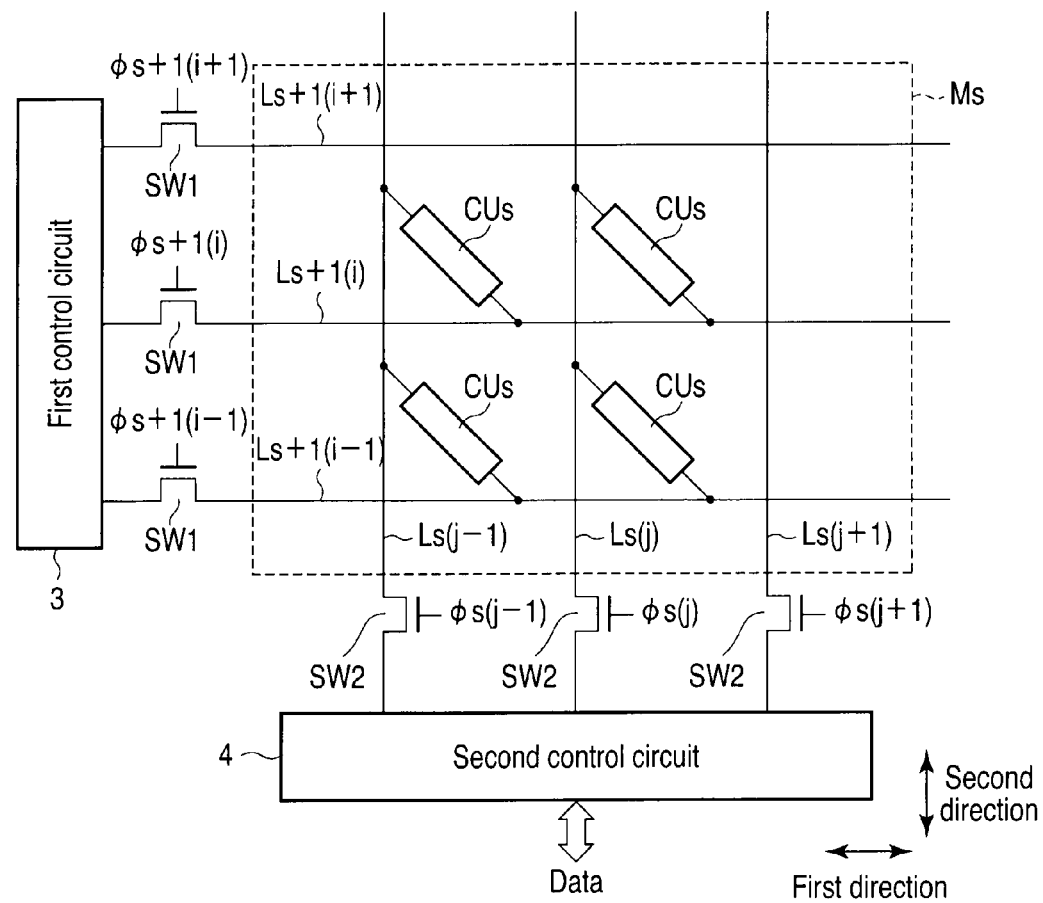
F I G. 5A

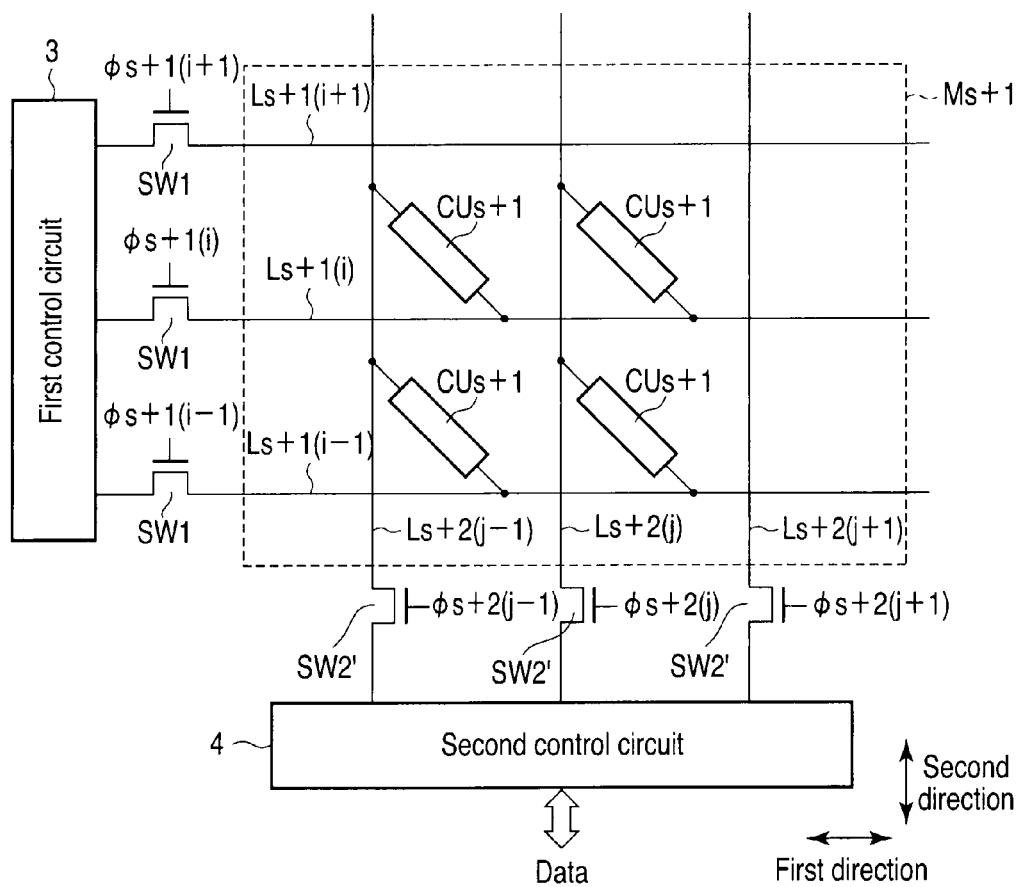
F I G. 5B

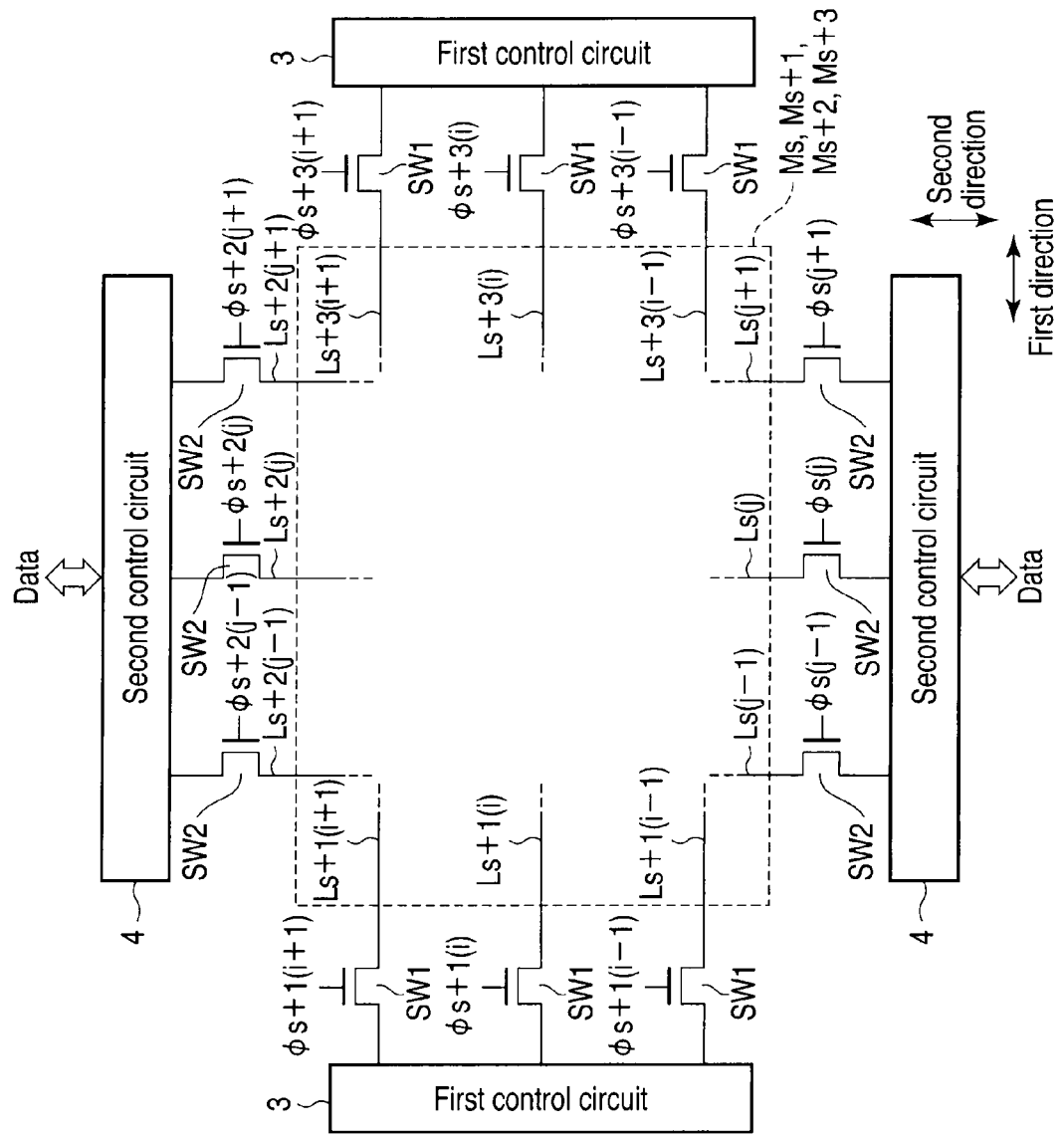
F I G. 6

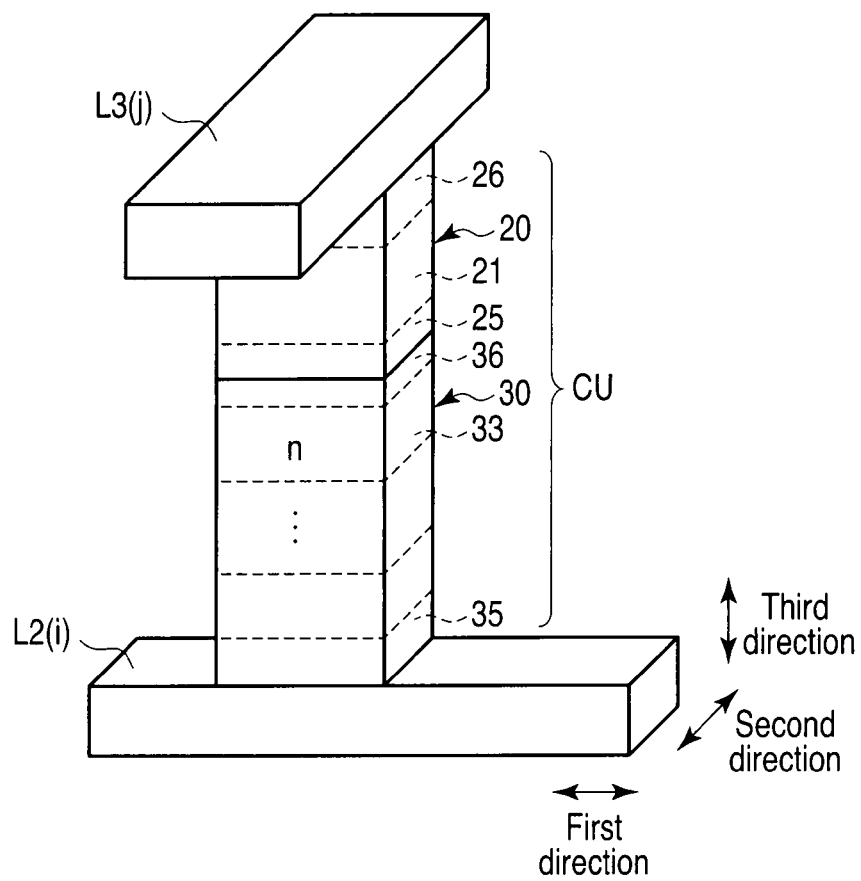
FIG. 7
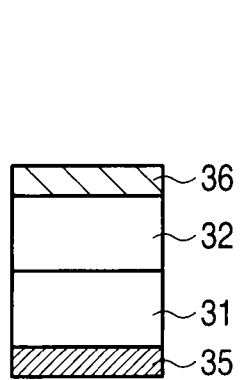
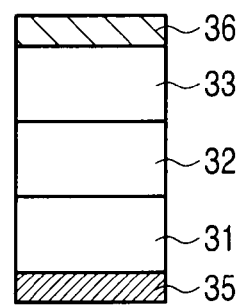
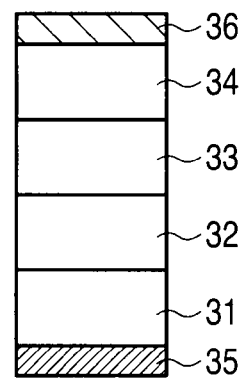
FIG. 8A     FIG. 8B     FIG. 8C

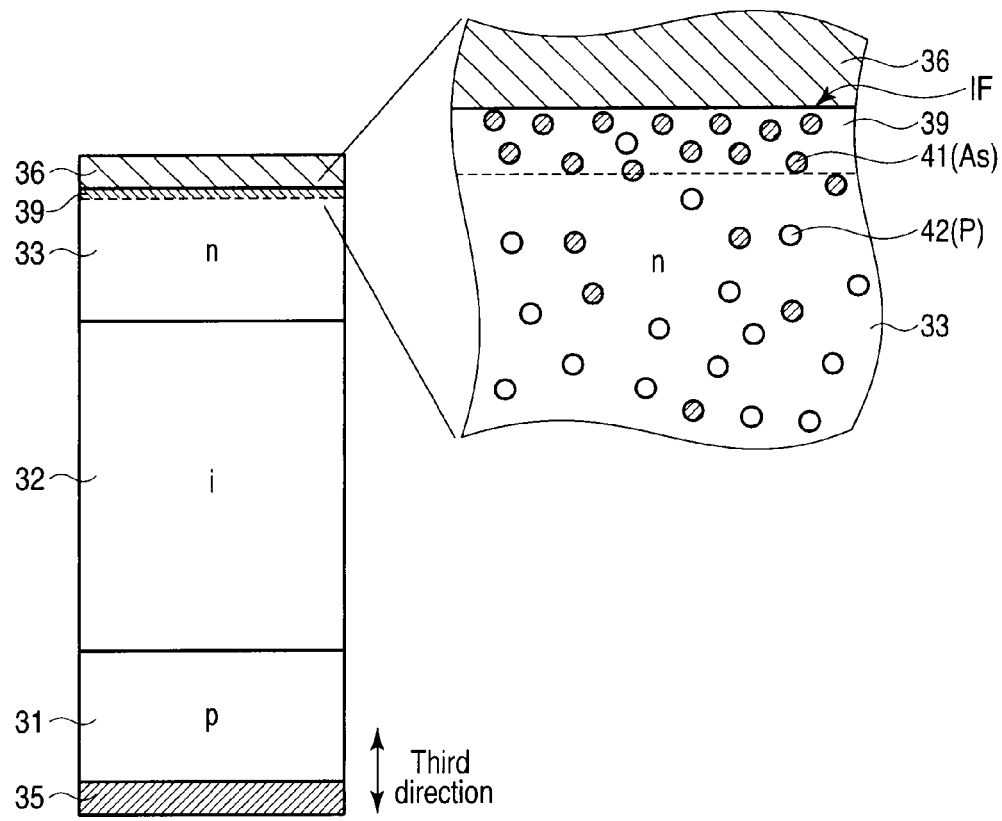
F I G. 9
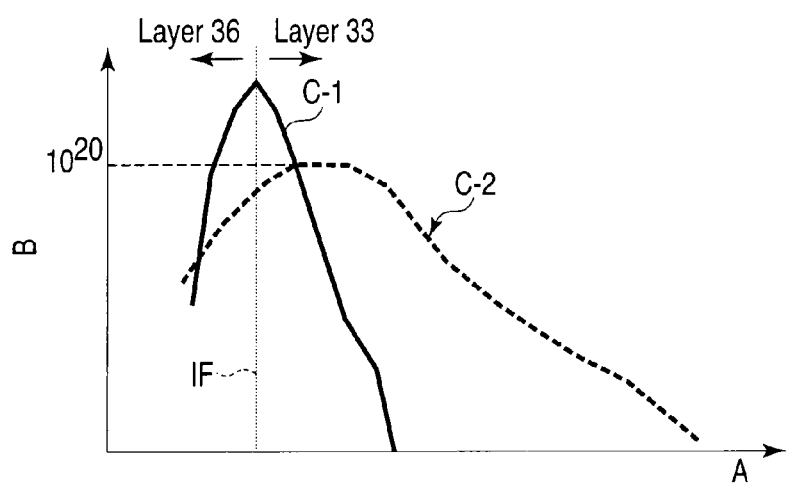
F I G. 10

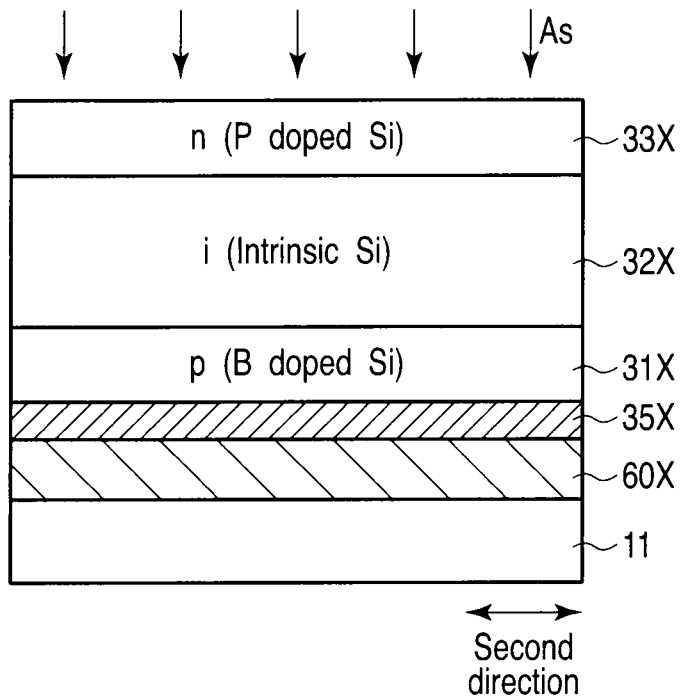
F I G. 11A
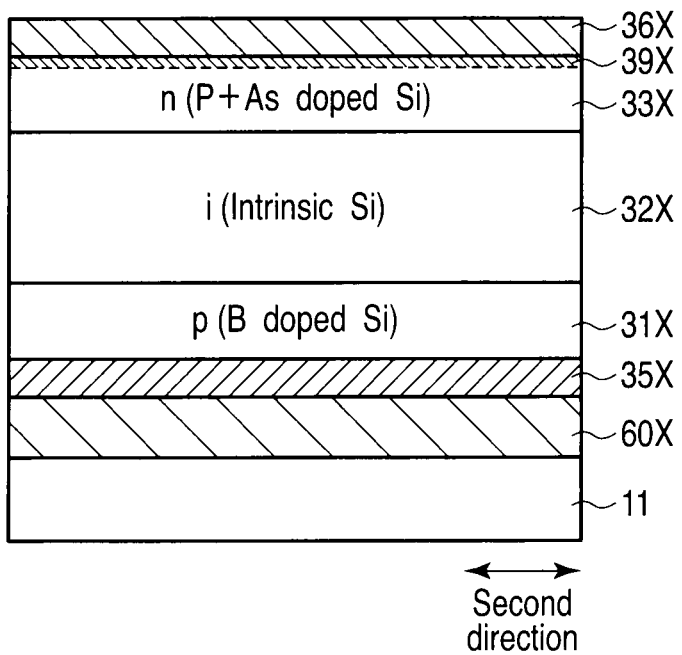
F I G. 11B

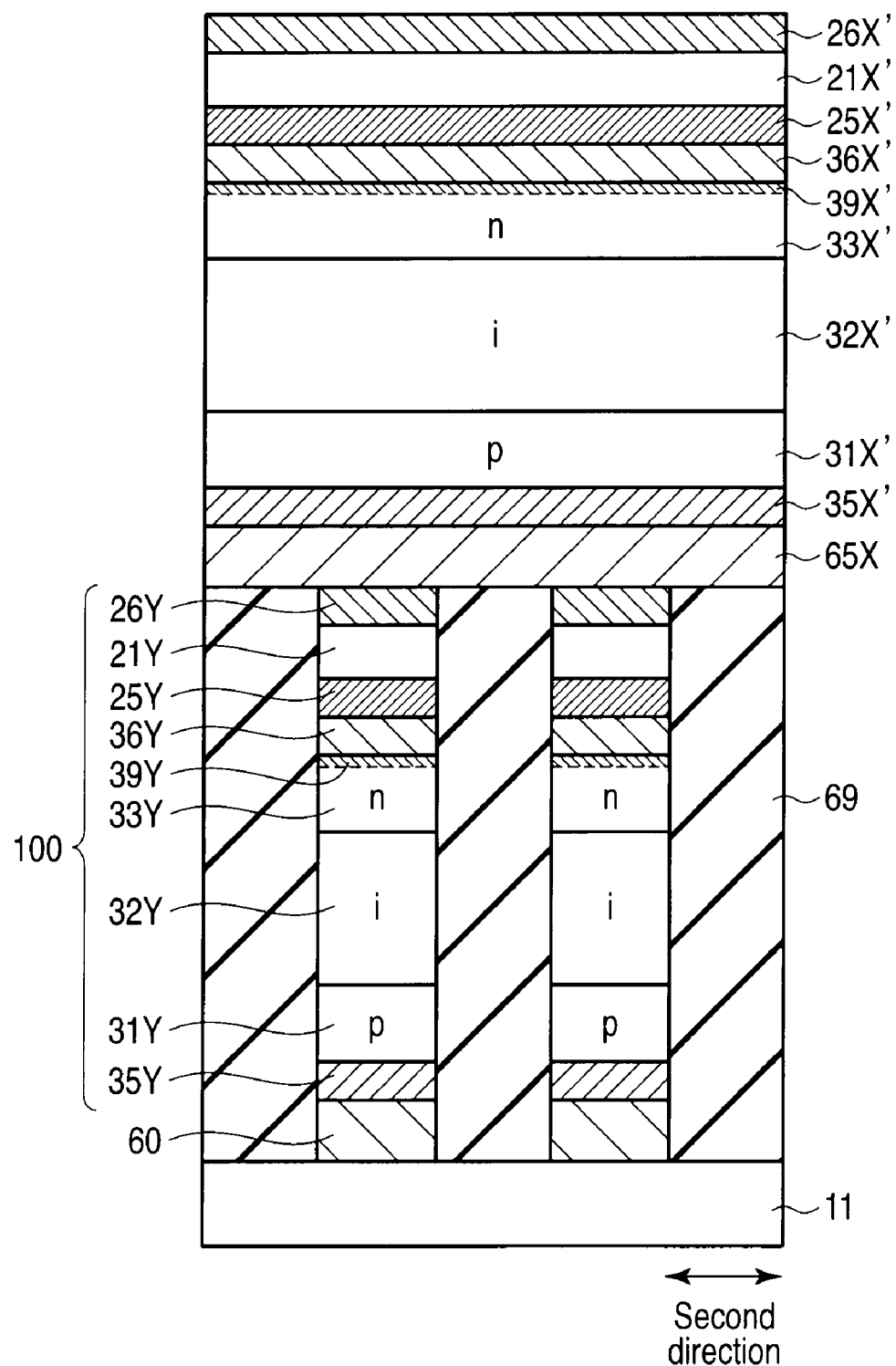
F I G. 11E

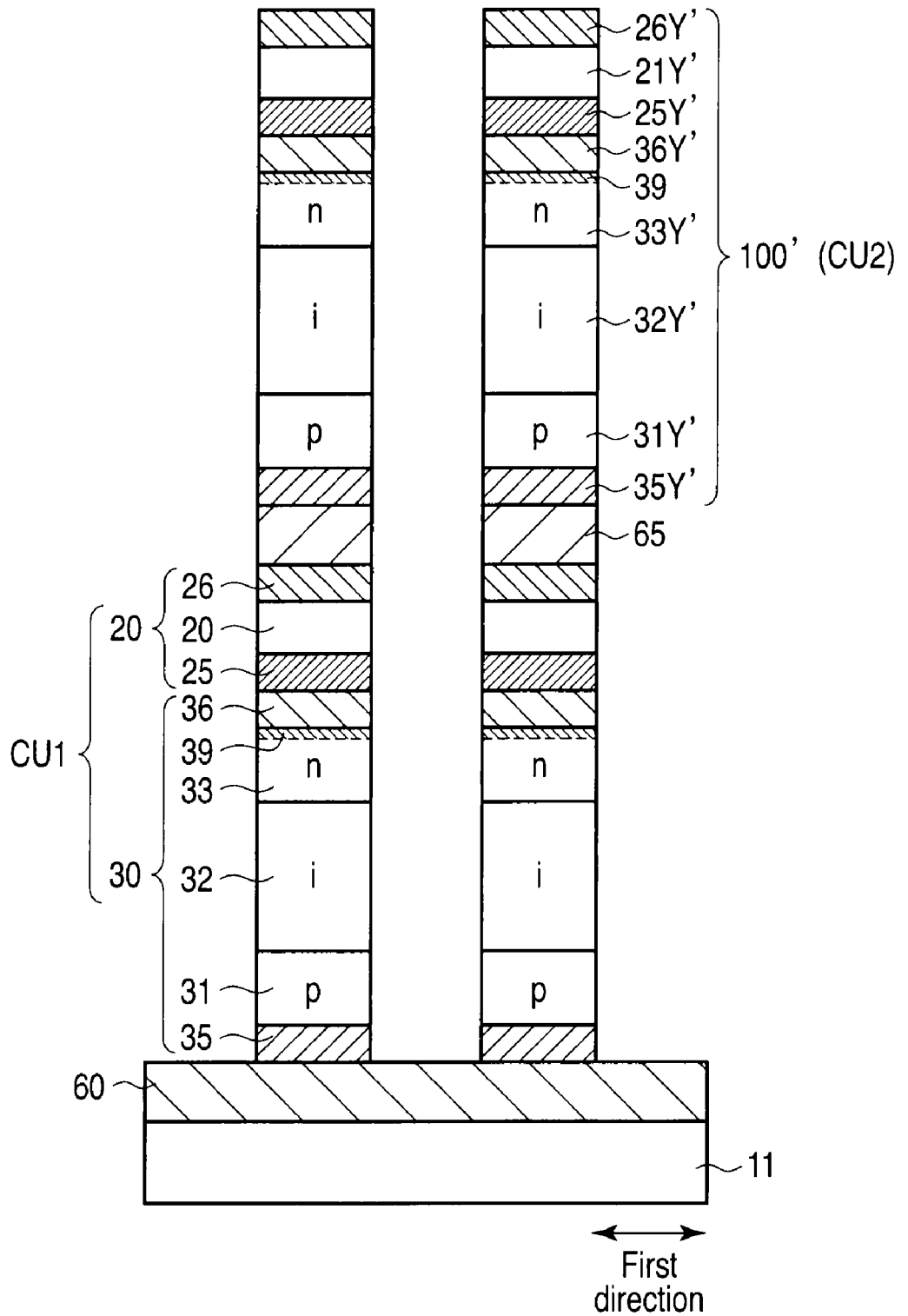
F I G. 11G

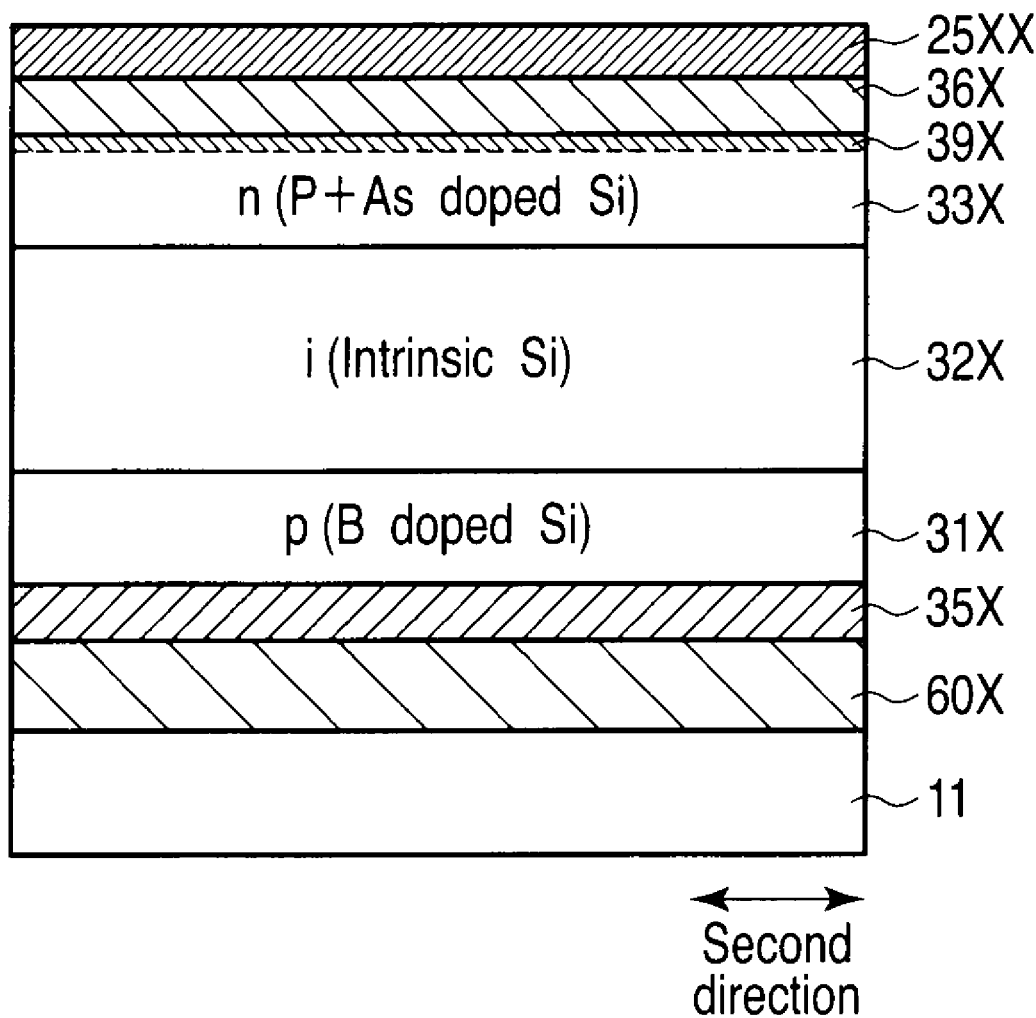
F I G. 11H

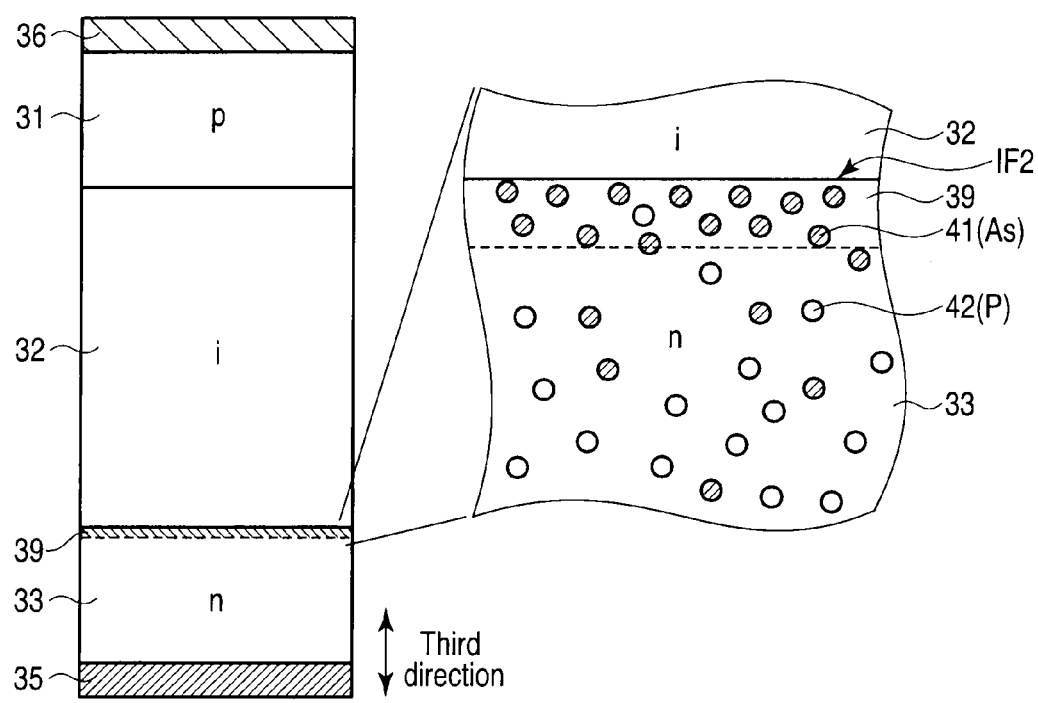
F I G. 13

RESISTANCE CHANGE MEMORY AND MANUFACTURING METHOD THEREOF

CROSS-REFERENCE TO RELATED APPLICATIONS

This application is based upon and claims the benefit of priority from Japanese Patent Application No. 2009-273788, filed Dec. 1, 2009; the entire contents of which are incorporated herein by reference.

FIELD

Embodiments described herein relate generally to a resistance change memory and manufacturing method thereof.

BACKGROUND

In recent years, resistance change memories, including a resistive RAM (ReRAM) which uses variable resistive elements as memory elements and a phase-change RAM (PCRAM) which uses phase-change elements as memory elements, have been attracting attention as next-generation nonvolatile semiconductor memories.

The resistance change memories are characterized in that their memory cell arrays are of the cross point type, that they can achieve a very large memory capacity by three-dimensional integration, and that they can operate at as high a speed as a DRAM.

In a resistance change memory, a cross-point memory cell array is included a plurality of cell units. A cell unit is composed of a memory element and a non-ohmic element.

To improve the operating characteristic of a resistance change memory, an improvement in the characteristic of a non-ohmic element and the suppression of the deterioration of the characteristic of the element are required.

One factor that degrades the characteristic of a non-ohmic element is regarded to be the effect of electric resistance (interface resistance) developed at the interface between a semiconductor layer and a conducting layer which constitute the non-ohmic element.

Jpn. Pat. Appln. KOKAI Publication No. 2008-182121 has disclosed a configuration where a high-impurity-concentration n-type diffusion layer is stacked on an n-type diffusion layer in the cathode region of a bidirectional diode to decrease the contact resistance.

BRIEF DESCRIPTION OF THE DRAWINGS

FIG. 3 shows the configuration of a cell unit of the memory call array of FIG. 2;
FIG. 5A shows a layout of a first and a second control circuit;
FIG. 5B shows a layout of the first and second control circuits;
FIG. 6 shows a layout of the first and second control circuits;
FIG. 7 shows a structure of a cell unit of the resistance change memory according to the embodiment;
FIG. 8A shows example of the configuration of a non-ohmic element of the resistance change memory according to the embodiment;
FIG. 8B shows example of the configuration of a non-ohmic element of the resistance change memory according to the embodiment;
FIG. 8C shows example of the configuration of a non-ohmic element of the resistance change memory according to the embodiment;
FIG. 9 shows an example of the configuration of a non-ohmic element of the resistance change memory according to the embodiment;
FIG. 10 shows a profile of impurities included in a non-ohmic element of the embodiment;
FIG. 11A shows a step of a resistance change memory manufacturing method according to the embodiment;
FIG. 11B shows a step of the resistance change memory manufacturing method according to the embodiment;
FIG. 11E shows a step of the resistance change memory manufacturing method according to the embodiment;
FIG. 11G shows a step of the resistance change memory manufacturing method according to the embodiment;
FIG. 11H shows a step of the resistance change memory manufacturing method according to the embodiment;
FIG. 13 is a diagram to explain a supplementary example of the embodiment.

DETAILED DESCRIPTION

Figure 1:
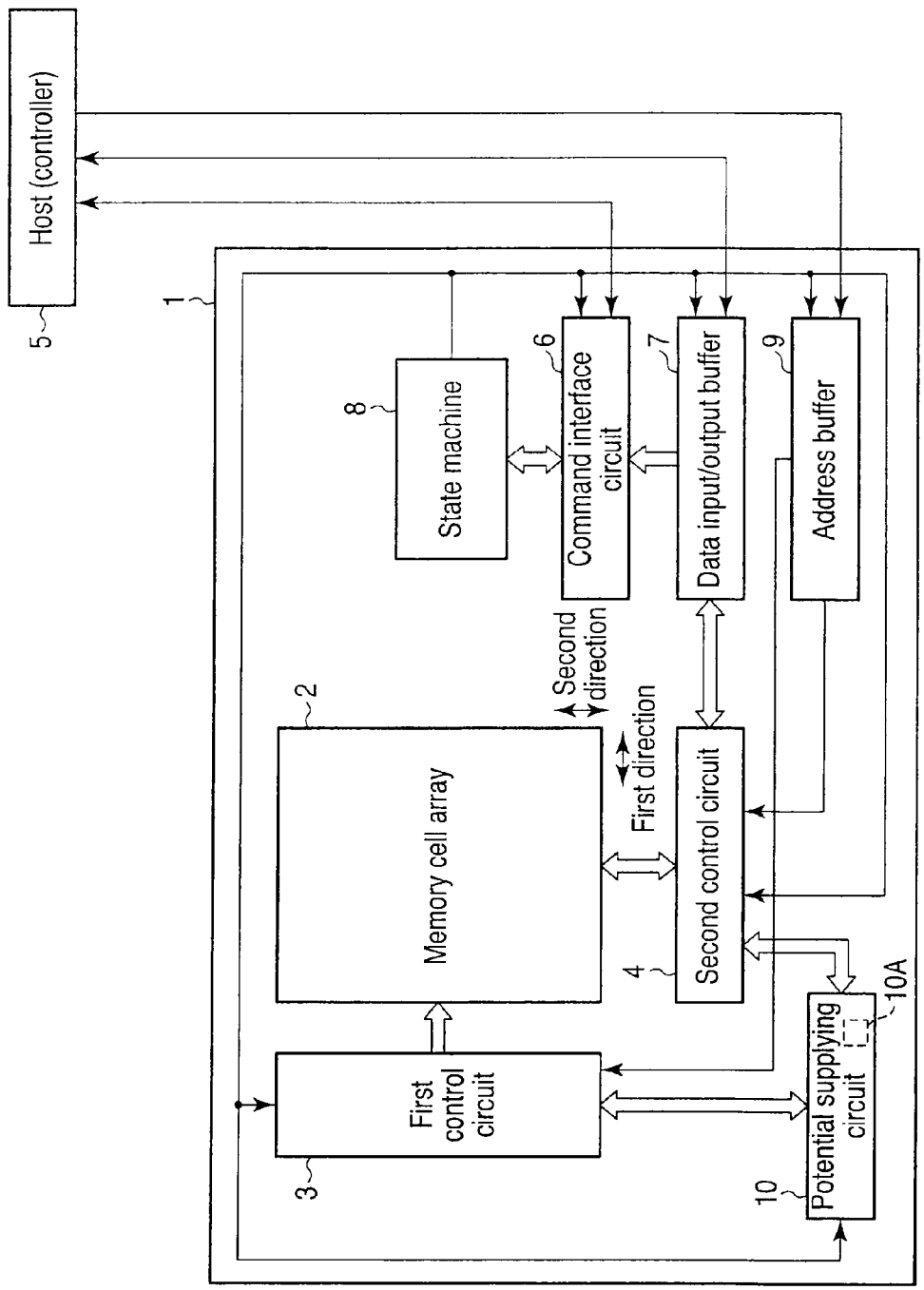
FIG. 1 shows the configuration of a resistance change memory according to an embodiment.

Hereinafter, referring to the accompanying drawings, an embodiment will be explained in detail. In the explanation below, elements which have the same functions and configuration are indicated by the same reference numerals and repeated explanations will be given as needed.

In general, according to one embodiment, a resistance change memory includes a first interconnect extending in a first direction, a second interconnect extending in a second direction intersecting with the first direction; and a cell unit which is provided between the first interconnect and the second interconnect. The cell unit includes a non-ohmic element and a memory element. The non-ohmic element includes a first silicon layer of an n-conductivity type and a conducting layer in contact with a first face of the first silicon layer. The memory element stores data according to a reversible change of a resistance state. The first silicon layer includes a first element and a second element as donor.

The embodiment will deal with a resistance change memory which uses a resistance change element or a phase change element as a memory element.

Embodiment (1) Structure
A resistance change memory according to an embodiment will be explained with reference to FIGS. 1 to 10.
FIG. 1 shows the main part of the resistance change memory.
The resistance change memory (e.g., chip) 1 includes a cross-point memory cell array 2.

A first control circuit 3 is arranged at one end of the memory cell array 2 in a first direction. A second control circuit 4 is arranged at one end of the memory cell array 2 in a second direction intersecting with the first direction.

The first control circuit 3 selects a row of the memory cell array 2 on the basis of, for example, a row address signal. The second control circuit 4 selects a column of the memory cell array 2 on the basis of, for example, a column address signal.

The first and second control circuits 3, 4 control the operation of writing, erasing, or reading data into or from memory elements of the memory cell array 2.

In the resistance change memory 1 of the embodiment, for example, writing is called set and erasing is called reset. The resistance value in the set state has only to differ from the resistance value in the reset state. It is not important whether the resistance value in the set state is larger or smaller than that in the reset state.

A multilevel resistance change memory where a memory element stores multilevel data can be realized by making it possible to selectively write one of a plurality of resistance-value levels the memory element can take in a set operation.

A controller 5 supplies a control signal and data to the resistance change memory 1. The control signal is input to a command interface circuit 6. The data is input to a data input/output buffer 7. The controller 5 may be provided in the chip 1 or in a chip (host unit) different from the chip 1.

The command interface circuit 6 determines on the basis of a control signal whether the data from the controller 5 is command data. If the data is command date, the data is transferred from the data input/output buffer 7 to a state machine 8.

The state machine 8 manages the operation of the resistance change memory 1 on the basis of command data. For example, on the basis of command data from the controller 5, the state machine 8 manages a set/reset operation and a read operation. The controller 5 can also receive status information managed by the state machine 8 and determine the operation result of the resistance change memory 1.

In a set/reset operation and a read operation, the controller 5 supplies an address signal to the resistance change memory 1. The address signal is input to the first and second control circuits 3, 4 via an address buffer 9.

On the basis of an instruction from the state machine 8, a potential supplying circuit 10 outputs a voltage pulse or a current pulse necessary for, for example, a set/reset operation and a read operation, with a specific timing. The potential supplying circuit 10, which includes a pulse generator 10A, controls the voltage value/current value and pulse width of a voltage pulse/current pulse to be output according to the operation shown by the command data and control signal.

Figure 2:
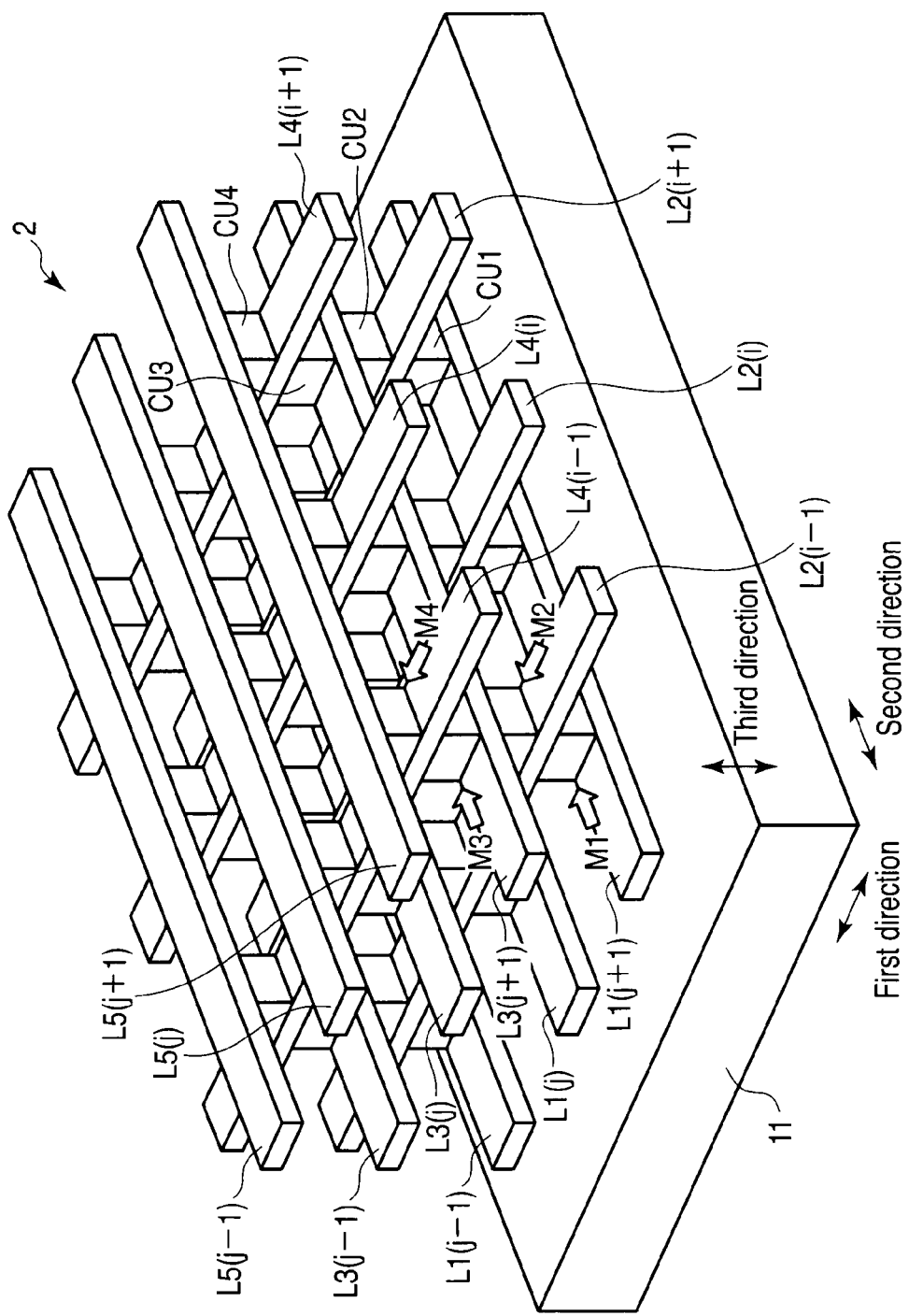
FIG. 2 shows the configuration of a memory cell array of the resistance change memory according to the embodiment.

FIG. 2 is a perspective view showing a structure of the memory cell array. The memory cell array of FIG. 2 has a cross-point structure.

The cross-point memory cell array 2 is provided on a substrate 11. The substrate 11 is a semiconductor substrate (e.g., a silicon substrate) or an interlayer insulating film on a semiconductor substrate. If the substrate 11 is an interlayer insulating film, a circuit using a field-effect transistor or the like may be formed as a peripheral circuit of the memory at the surface of the semiconductor substrate below the cross-point memory cell array 2.

The cross-point memory cell array 2 has, for example, a stack structure of a plurality of memory cell arrays (also referred to as memory cell layers).

FIG. 2 shows a case where the cross-point memory cell array 2 is composed of four memory cell arrays M1, M2, M3, M4 stacked in a third direction (a direction perpendicular to the principal plane of the substrate 11). The number of memory cell arrays to be stacked has only to be not less than two. The cross-point memory cell array 2 may be composed of a memory cell array. An insulating film may be provided between two memory cell arrays stacked to electrically isolate the arrays from each other.

As shown in FIG. 2, when a plurality of memory cell arrays M1, M2, M3, M4 are stacked, an address signal includes, for example, a memory cell array select signal, a row address signal, and a column address signal. The first and second control circuits 3, 4 select one of the stacked memory cell arrays on the basis of, for example, a memory cell array select signal. The first and second control circuits 3, 4 can not only write, erase, or read data into or from one of the stacked memory cell arrays but also write, erase, or read data into or from not less than two or all of the stacked memory cell arrays simultaneously.

Memory cell array M1 is composed of a plurality of cell units CU1 arranged in an array in the first and second directions. Similarly, memory cell array M2 is composed of a plurality of cell units CU2 arranged in an array. Memory cell array M3 is composed of a plurality of cell units CU3 arranged in an array. Memory cell array M4 is composed of a plurality of cell units CU4 arranged in an array.

Each of the cell units CU1, CU2, CU3, CU4 is composed of a memory element and a non-ohmic element connected in series.

On the substrate 11, interconnects $L1(j-1)$, $L1(j)$, $L1(j+1)$, interconnects $L2(i-1)$, $L2(i)$, $L2(i+1)$, interconnects $L3(j-1)$, $L3(j)$, $L3(j+1)$, interconnects $L4(i-1)$, $L4(i)$, $L4(i+1)$, and interconnects $L5(j-1)$, $L5(j)$, $L5(j+1)$ are arranged in that order from the substrate 11 side.

The odd-numbered interconnects from the substrate 11 side, that is, interconnects $L1(j-1)$, $L1(j)$, $L1(j+1)$, interconnects $L3(j-1)$, $L3(j)$, $L3(j+1)$, and interconnects $L5(j-1)$, $L5(j)$, $L5(j+1)$, extend in the second direction.

The even-numbered interconnects from the substrate 11 side, that is, interconnects $L2(i-1)$, $L2(i)$, $L2(i+1)$ and interconnects $L4(i-1)$, $L4(i)$, $L4(i+1)$, extend in the first direction intersecting with the second direction. Those interconnects are used as word lines or bit lines.

A first memory cell array M1 at the bottom is arranged between first interconnects $L1(j-1)$, $L1(j)$, $L1(j+1)$ and second interconnects $L2(i-1)$, $L2(i)$, $L2(i+1)$. In the operation of set, reset, or reading memory cell array M1, either interconnects $L1(j-1)$, $L1(j)$, $L1(j+1)$ or interconnects $L2(i-1)$, $L2(i)$, $L2(i+1)$ are used as word lines and the rest are used as bit lines.

Memory cell array M2 is arranged between second interconnects $L2(i-1)$, $L2(i)$, $L2(i+1)$ and third interconnects $L3(j-1)$, $L3(j)$, $L3(j+1)$. In the operation of set, reset, or reading memory cell array M2, either interconnects $L2(i-1)$, $L2(i)$, $L2(i+1)$ or interconnects $L3(j-1)$, $L3(j)$, $L3(j+1)$ are used as word lines and the rest are used as bit lines.

Memory cell array M3 is arranged between third interconnects $L3(j-1)$, $L3(j)$, $L3(j+1)$ and fourth interconnects $L4(i-1)$, $L4(i)$, $L4(i+1)$. In the operation of set, reset, or reading memory cell array M3, either interconnects $L3(j-1)$, $L3(j)$, $L3(j+1)$ or interconnects $L4(i-1)$, $L4(i)$, $L4(i+1)$ are used as word lines and the rest are used as bit lines.

Memory cell array M4 is arranged between fourth interconnects $L4(i-1)$, $L4(i)$, $L4(i+1)$ and fifth interconnects $L5(j-1)$, $L5(j)$, $L5(j+1)$. In the operation of set, reset, or reading memory cell array M4, either interconnects $L4(i-1)$, $L4(i)$, $L4(i+1)$ or interconnects $L5(j-1)$, $L5(j)$, $L5(j+1)$ are used as word lines and the rest are used as bit lines.

Cell units CU1, CU2, CU3, CU4 are arranged at the intersections of interconnects $L1(j-1)$, $L1(j)$, $L1(j+1)$ and interconnects L2($i$−1), L2($i$), L2($i$+1), at the intersections of interconnects L2($i$−1), L2($i$), L2($i$+1) and interconnects L3($j$−1), L3($j$), L3($j$+1), at the intersections of interconnects L3($i$−1), L3($j$), L3($j$+1) and interconnects L4($i$−1), L4($i$), L4($i$+1), and at the intersections of interconnects L4($i$−1), L4($i$), L4($i$+1) and interconnects L5($j$−1), L5($j$), L5($j$+1), respectively. That is, in the cross-point memory cell array 2, cell units are arranged at the intersections of interconnects stacked consecutively in the third direction.

When the stacked memory cell arrays are isolated layer by layer with insulating films, the interconnects are not shared by the stacked memory cell arrays and interconnects serving as word lines and bit lines are provided for the memory cell array in each layer.

FIG. 3 shows a structure of interconnects and cell units in the cross-point memory call array.

FIG. 3 shows cell units CU1, CU2 of two memory cell arrays M1, M2 of FIG. 2. In this case, the configuration of cell units in two memory cell arrays M3, M4 of FIG. 2 is the same as that of cell units in two memory cell arrays M1, M2 of FIG. 2.

Each of cell units CU1, CU2 is composed of a memory element and a non-ohmic element connected in series. For example, a rectifying device is used as the non-ohmic element.

The relation of connection between a memory element and a rectifying device as a non-ohmic element has various patterns. Here, all the cell units in a memory cell array must have the same relation of connection between a memory element and a rectifying device.

Figure 4:
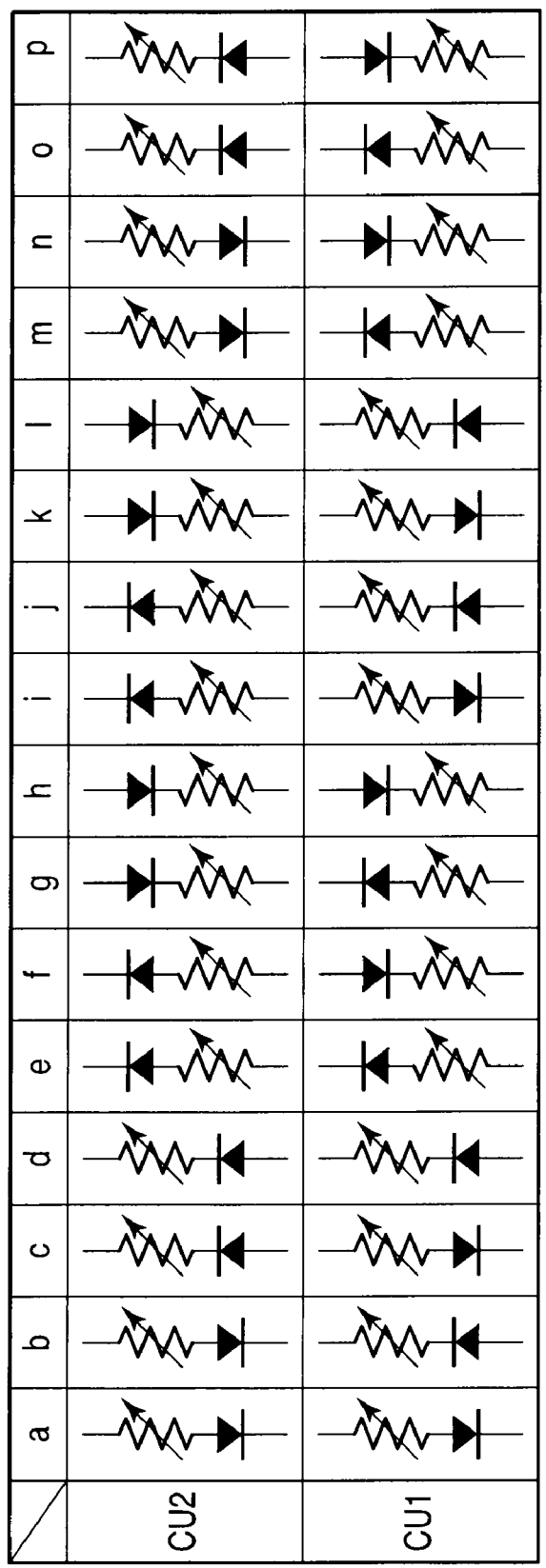
FIG. 4 shows the relation of connection between memory elements and rectifying devices.

FIG. 4 shows the relation of connection between a memory element and a rectifying device.

In a cell unit, the relation of connection between a memory element and a rectifying device has four patterns in total: two patterns of positional relation between a memory element and a rectifying device and two patterns of direction of a rectifying device. Accordingly, in cell units in two memory cell arrays, the relation of connection between a memory element and a rectifying device has 16 patterns (4×4 patterns).

In FIG. 4, "a" to "p" show the 16 patterns of the relation of connection.

The embodiment is applicable to all of the 16 patterns.

FIGS. 5A and 5B show a first example of the layout of the first and second control circuits.

A memory cell array Ms corresponding to any one of memory cell arrays M1, M2, M3, M4 shown in FIG. 2 is composed of a plurality of cell units CUs arranged in an array as shown in FIG. 5A. One end of a cell unit CUs is connected to interconnects Ls($j$−1), Ls($j$), L4($j$+1). The other end of the cell unit CUs is connected to interconnects Ls+1($i$−1), Ls+1($i$), Ls+1($i$+1).

Memory cell array Ms+1 is composed of a plurality of cell units CUs+1 arranged in an array as shown in FIG. 5B. One end of a cell unit CUs+1 is connected to interconnects Ls+1($i$−1), Ls+1($i$), Ls+1($i$+1). The other end of the cell unit CUs+1 is connected to interconnects Ls+2($j$−1), Ls+2($j$), Ls+2($j$+1).

Here, let "s" be 1, 3, 5, 7, . . . .

The first control circuit 3 is connected via a switch element SW1 to one end of each of interconnects Ls+1($i$−1), Ls+1($i$), Ls+1($i$+1) in the first direction. Switch element SW1 is controlled by, for example, control signals φs+1($i$−1), φs+1($i$), φs+1($i$+1). Switch element SW1 is composed of, for example, an n-channel field-effect transistor (FET).

The second control circuit 4 is connected via a switch element SW2 to one end of each of interconnects Ls($j$−1), Ls($j$), Ls($j$+1) in the second direction. Switch element SW2 is controlled by, for example, control signals φs($j$−1), φs($j$), φs($j$+1). Switch element SW2 is composed of, for example, an n-channel FET.

The second control circuit 4 is connected via a switch element SW2' to one end of each of interconnects Ls+2($j$−1), Ls+2($j$), Ls+2($j$+1) in the second direction. Switch element SW2' is controlled by, for example, control signals φs+2($j$−1), φs+2($j$), φs+2($j$+1). Switch element SW2' is composed of, for example, an n-channel FET.

FIG. 6 shows a second example of the layout of the first and second control circuits. In FIG. 6, since the configuration of memory cell arrays Ms, Ms+1, Ms+2, Ms+3 is essentially the same as that of the memory cell arrays shown in FIGS. 5A and 5B, the configuration of the memory cell arrays is not shown in FIG. 6.

The layout of the second example differs from that of the first example in that the first control circuit 3 is arranged at either end of memory cell arrays Ms, Ms+1, Ms+2, Ms+3 in the first direction and the second control circuit 4 is arranged at either end of memory cell arrays Ms, Ms+1, Ms+2, Ms+3 in the second direction.

Here, let "s" be 1, 5, 9, 13, . . . .

The first control circuit 3 is connected via a switch element SW1 to either end of each of interconnects Ls+1($i$−1), Ls+1($i$), Ls+1($i$+1) in the first direction. Switch element SW1 is controlled by, for example, control signals φs+1($i$−1), φs+1($i$), φs+1($i$+1), φs+3($i$−1), φs+3($i$), φs+3($i$+1). Switch element SW1 is composed of, for example, an n-channel FET.

The second control circuit 4 is connected via a switch element SW2 to either end of each of interconnects Ls($j$−1), Ls($j$), Ls($j$+1) in the second direction. Switch element SW2 is controlled by, for example, control signals φs($j$−1), φs($j$+1), φs+2($j$−1), φs+2($j$), φs+2($j$+1). Switch element SW2 is composed of, for example, an n-channel FET.

FIG. 7 is a perspective view to explain the configuration of a cell unit in the resistance change memory of the embodiment.

As shown in FIG. 7, a cell unit CU is arranged between two interconnects (word line, bit line) L2($i$), L3($j$) crossing each other.

In the cross-point memory cell array 2, a memory element 20 and a non-ohmic element 30 are connected in series between two interconnects to cause current to flow only in the selected memory element.

In the cell unit CU of the embodiment of FIG. 7, a stacked unit composed of a memory element (resistance change type storage element) 20 and a non-ohmic element 30 in such a manner that the memory element 20 is stacked on the non-ohmic element 30 is sandwiched as a cell unit CU between two interconnects L2($i$), L3($j$).

The structure of the cell unit CU shown in FIG. 7 is one example. The non-ohmic element 30 may be stacked on the memory element 20 according to the relation of connection between cell units shown in FIG. 4.

The memory element 20 is a variable resistive element or a phase-change element. A variable resistive element is an element made of a material whose resistance value varies with energy, such as voltage, current, or heat. A phase-change element is an element made of a material whose solid-state properties, including resistance value, capacitance, and impedance, vary according to the change of crystal phase.

The term phase change (phase transition) includes the following:

Metal-semiconductor transition, metal-insulator transition, metal-metal transition, insulator-insulator transition, insulator-semiconductor transition, insulator-metal transition, semiconductor-semiconductor transition, semiconductor-metal transition, and semiconductor-insulator transition Phase change of quantum state (metal-superconductor transition or the like)

Paramagnet-ferromagnet transition, anti ferromagnet-ferromagnet transition, ferromagnet-ferromagnet-ferromagnet transition, ferrimagnet-ferromagnet transition, and transitions composed of a combination of these transitions Paraelectric-ferroelectric transition, paraelectric-pyroelectric transition, paraelectric-piezoelectric transition, ferroelectric-ferroelectric transition, anti ferroelectric-ferroelectric transition, and transitions composed of a combination of these transitions Transitions composed of a combination of the above transitions For example, the transition from metal, insulator, semiconductor, ferroelectric, paraelectric, pyroelectric, piezoelectric, ferromagnet, ferrimagnet, helimagnet, paramagnet, or anti-ferromagnet to ferroelectric ferromagnet and vice versa According to this definition, a variable resistive element includes a phase-change element. In the embodiment, a variable resistive element refers to an element composed primarily of metal oxide (e.g., binary or ternary metal oxide), metal compound, chalcogenide material (e.g., Ge—Sb—Te or In—Sb—Te), organic thin film, carbon, or carbon nanotube.

As for a magnetoresistive element used for a magnetoresistive RAM (MRAM), the resistance value of the element varies according to the change of the relative directions of magnetization of two magnetic layers constituting the element. In the embodiment, for example, a magnetoresistive element, such as a magnetic tunnel junction (MTJ) element, is also included in the variable resistive element.

A method of changing the resistance value of the memory element 20 includes a bipolar operation and a unipolar operation.

In a bipolar operation, the resistance value of the memory element 20 is changed reversibly at least between a first value (a first level) and a second value (a second level) by changing the polarity of a voltage applied to the memory element 20.

In a unipolar operation, the resistance value of the memory element is changed reversibly at least between a first value and a second value by controlling the magnitude of the voltage, the applying time, or both without changing the polarity of the voltage applied to the memory element.

The bipolar operation is applied to a memory where current must flow in a memory element bidirectionally in a write operation, such as a spin transfer MRAM.

The memory element 20 includes electrode layers 25, 26 at one and the other ends of it in the third direction (a direction in which layers are stacked). At the bottom of the memory element 20, the electrode layer 25 is provided. At the top of the memory element 20, the electrode layer 26 is provided. The electrode layers 25, 26 are used as, for example, the electrodes of the memory element. The electrode layers 25, 26 are composed of, for example, a metal film, an alloy film, a metal compound film, a semiconductor film with conductive properties, or a stacked film composed of these films.

In the embodiment, a part sandwiched between two electrode layers 25, 26 is called a resistance change film 21. The resistance change film 21 is a film made of a material whose resistance value or crystal phase varies with energy, such as voltage, current, or heat. The resistance change film 21 is made of a material whose resistance value or crystal phase in film varies according to the energy applied to the film. The resistance change film 21 may be made of a material whose resistance value (or crystal phase) varies as a result of a change in the characteristic of the interface between the resistance change film 21 and the electrode layers 25, 26 caused by the applied energy. In this case, the nature of the memory element 20 whose resistance value varies can be obtained stably by suitably combining the material used for the resistance change film 21 and the material used for the electrode layers 25, 26.

The electrode layers 25, 26 may be used as layers that prevent impurities attributable to the underlying element 30 and interconnect L3(j) from diffusing into the memory element 20. In addition, the electrode layers 25, 26 may be used as adhesion layers that prevent the memory element 20 from separating from the underlying element 30 and interconnect L3(j).

The input-output characteristic (voltage-current characteristic) of the non-ohmic element 30 is nonlinear. That is, the non-ohmic element 30 has a non-ohmic characteristic.

The non-ohmic element 30 has conducting layers 35, 36 at one and the other of it in the third direction (a direction in which layers are stacked). At the bottom of the non-ohmic element 30, the conducting layer 35 is provided. At the top of the non-ohmic element, the conducting layer 36 is provided.

The conducting layers 35, 36 are used as, for example, the electrodes of the non-ohmic element. The conducting layers 35, 36 are made of any one of silicide, metal, metal compound, and conductive semiconductor. Hereinafter, the conducting layers 35, 36 using silicide are also particularly called silicide layers 35, 36.

As described above, in the memory element 20 and non-ohmic element 30 constituting the cell unit CU, a conducting layer serving as an electrode is provided at either end of each of the elements 20, 30. This produces a structure where the conducting layers (conductors) 25, 36 acting as the electrodes of the element intervene between the memory element 20 (resistance change film 21) and non-ohmic element 30.

The conducting layers 25, 36 between the memory element 20 and non-ohmic element 30 are not limited to two conducting layers 25, 36 provided for each element and may be one conducting layer shared by two elements 20, 30. In addition, a diffusion prevention layer or an adhesion layer may be further provided between the electrode layer 25 and conducting layer 36.

The non-ohmic element 30 has any one of stack structures composed of a plurality of layers shown in FIGS. 8A and 8B according to the structure of the cell unit or the operation required for the resistance change memory.

In the example of FIG. 8A, the non-ohmic element 30 includes two layers (films) 31, 32 sandwiched between two conducting layers (electrodes) 35, 36. A first layer 31 and a second layer 32 form a junction necessary for their input/output characteristics to be non-ohmic.

Non-ohmic elements with such a two-layer structure include p-n diodes and Schottky diodes.

A p-n diode is a diode where a p-type semiconductor layer (anode layer) and an n-type semiconductor layer (cathode layer) form a p-n junction. In this case, of the two layers 31, 32, one layer is a p-type semiconductor layer and the other is an n-type semiconductor layer.

A Schottky diode is a diode where a semiconductor layer and a metal layer form a Schottky junction. In this case, of the two layers 31, 32, one layer is a semiconductor layer and the other is a metal layer.

In the example of FIG. 8B, the non-ohmic element 30 is composed of three layers, (films) 31, 32, 33 provided between two conducting layers 35, 36. A second layer 32 is sandwiched between a first layer 31 and a third layer 33. The three layers 31, 32, 33 form a junction necessary for their output characteristics to be non-ohmic.

Non-ohmic elements 30 with such a three-layer structure include p-i-n diodes and Metal-Insulator-Semiconductor (MIS) diodes. Non-ohmic elements with a three-layer structure excluding diodes include a Semiconductor-Insulator-semiconductor (SIS) structure and a Metal-Insulator-Metal (MIM) structure.

A p-i-n diode is a diode which includes an intrinsic semiconductor layer between a p-type semiconductor layer (anode layer) and an n-type semiconductor layer (cathode layer). In this case, a layer 32 sandwiched between two layers 31, 33 is an intrinsic semiconductor layer. Of the two layers 31, 33, one layer is a p-type semiconductor layer and the other is an n-type semiconductor layer. An intrinsic semiconductor layer may not only include no n-type or p-type impurities but also have a lower impurity concentration than that of each of the n-type and p-type semiconductor layers.

A MIS diode is a diode which includes an insulating layer between a metal layer and a semiconductor layer. In this case, a layer 32 sandwiched between two layers 31, 33 is an insulating layer. Of the two layers 31, 33, one layer is a semiconductor layer and the other is a metal layer.

In the MIM structure or SIS structure, both of two layers 31, 33 are metal layers or semiconductor layers. A layer 32 sandwiched between two layers 31, 33 is an insulating layer.

In the example of FIG. 8C, the non-ohmic element 30 is composed of four layers, 31, 32, 33, 34 provided between two conducting layers 35, 36. The four layers 31, 32, 33, 34 form a junction necessary so that their input/output characteristics are non-ohmic. Non-ohmic elements 30 with such a four-layer structure include semiconductor-metal-insulator-semiconductor (SMIS) diodes. A SMIS diode has a structure in which a semiconductor layer is added to a MIS diode, with a metal layer and an insulating layer sandwiched between two semiconductor layers 31, 34. Of the two layers 32, 33 sandwiched between two semiconductor layers 31, 34, one layer is a metal layer and the other is an insulating layer.

In a resistance change memory actuated by a unipolar operation, a rectifying device, such as a diode, is primarily used as a non-ohmic element 30. In a resistance change memory actuated by a bipolar operation, a MIM structure or an SIS structure is primarily used a non-ohmic element 30.

In the embodiment, a resistance change memory using mainly a unipolar operation will be explained. Of course, the resistance change memory of the embodiment may be a memory using a bipolar operation.

When a resistance change memory with a cross-point memory cell array (hereinafter, referred to as a cross-point resistance change memory) is actuated by a unipolar operation, the rectifying device 30 acting as a non-ohmic element is required to carry a large current (hereinafter, referred to as forward current) when a forward bias is applied, a small current (hereinafter, referred to as reverse current) when a reverse bias is applied, and have a high breakdown voltage to perform a set-reset operation and a read operation accurately.

As shown in FIG. 7, the non-ohmic element 30 includes a semiconductor layer 33 of a first conductivity type (n-type). The semiconductor layer 33 is, for example, an n-type silicon layer. The n-type silicon layer (a first silicon layer) 33 includes two types of impurity elements (first and second elements) to add a conductivity type.

In FIG. 7, a silicide layer 36 is provided on the n-type silicon layer 33 in such a manner that the former and the latter are in contact with each other. The silicide layer 36 adjoins the top face (a first face) of the n-type silicon layer 33.

The embodiment is not limited to the structure of FIG. 7. For instance, an n-type silicon layer 36 may be provided on the conducting layer 35 made of silicide to cause the silicide layer 35 and n-type silicon layer 33 to contact each other. In this case, the silicide layer 36 adjoins the bottom face (a second face) of the n-type silicon layer 33.

Furthermore, both of the conducting layers 35, 36 may be made of silicide and an independent n-type silicon layer may contact each of the silicide layers 35, 36. The conducting layers 35, 36 not in contact with the n-type silicon layer may be made of not only silicide but also a conducting compound, such as metal or TiN.

The structure of the non-ohmic element 30 of the resistance change memory of the embodiment will be explained concretely with reference to FIG. 9. In FIG. 9, a p-i-n diode is used as an example of the non-ohmic element.

In FIG. 9, a semiconductor layer 31 of a second conductivity type (p type) is provided on the conducting layer 35. The second semiconductor layer 31 is, for example, a p-type silicon layer (second silicon layer). The p-type silicon layer 31 is provided on the bottom face (a second face) side of the n-type silicon layer 33.

The p-type silicon layer 31 is used as an anode layer of the p-i-n diode 30. The film thickness of the p-type silicon layer 31 is about 3 nm to 30 nm.

The p-type silicon layer 31 includes boron (B) as elements acting as acceptor-type impurities (hereinafter, referred to as acceptor impurities) to give a p-type conductivity to silicon. The conducting layer 35 is made of, for example, silicide or TiN.

On the p-type silicon layer 31, an intrinsic silicon layer (hereinafter, referred to as an i-type silicon layer) 32 is provided. The film thickness of the i-type silicon layer (a third silicon layer) 32 is, for example, about 60 nm to 120 nm.

On the i-type silicon layer, an n-type silicon layer 33 is provided.

The n-type silicon layer 33 is used as a cathode layer of the p-i-n diode 30. In the embodiment, the n-type silicon layer 33 includes both arsenic (As) and phosphorus (P) as elements acting as donor-type impurities (hereinafter, referred to as donor impurities) to give an n-type conductivity to silicon. The film thickness of the n-type silicon layer 33 is, for example, about 3 nm to 30 nm.

Donor impurities are not limited to arsenic and phosphorus. In the embodiment, at least two different elements serving as donor impurities to a semiconductor layer (in this example, silicon) have only to be included in the semiconductor layer.

On the n-type silicon layer 31, a conducting layer 36 is provided. The conducting layer 36 is made of silicide. For example, titanium silicide ($TiSi_x$) is used. One of nickel silicide ($NiSi_x$), cobalt silicide ($CoSi_x$), palladium silicide ($PdSi_x$), and platinum silicide ($PtSi_x$) may be used for the conducting layer made of silicide. Here, "x" in the composition formula of silicide takes a value in the range from 1 to 2.

The n-type silicon layer 33 and silicide layer 36 contact each other, forming an interface IF between the n-type silicon layer 33 and silicide layer 36. If the interface between the n-type silicon layer 33 and silicide layer 36 is not definite, the interface IF might become a layer of a specific thickness (a dimension in depth) in the third direction (a direction in which layers are stacked).

As described above, the p-type silicon layer 31, i-type silicon layer 32, and n-type silicon layer 33 are stacked in that order on the conducting layer 35. Here, which one of the p-type silicon layer 31 and n-type silicon layer 33 is higher in level than the other is determined by the relation of connection between cell units shown in FIG. 4. That is, silicon layers may be stacked in this order: the n-type silicon layer, i-type silicon layer, and p-type silicon layer, starting from the conducting layer 35 side.

Each of the silicon layers 31, 32, 33 constituting a p-i-n diode is composed of an epitaxial layer, such as polysilicon or single-crystal silicon. Each of the silicon layers 31, 32, 33 is an epitaxial layer (polycrystalline layer or single-crystal layer) obtained by crystallizing a silicon layer deposited in an amorphous state by a heating treatment.

Each of the silicon layers 31, 32, 33 has only to be made mostly of silicon and may be made of silicon germanium (SiGe), silicon carbide (SiC), silicon tin (SiSn), or the like.

As shown in FIG. 9, the resistance change memory of the embodiment is characterized in that the n-type silicon layer (a semiconductor layer of the first conductivity type) 33 including a non-ohmic element includes two types of donor impurities 41, 42. The two types of donor impurities (a first and a second element) included in the n-type silicon layer 33 are, for example, arsenic (As) 41 and phosphorus (P) 42.

Hereinafter, the non-ohmic element (p-i-n diode) of the embodiment will be explained with reference to FIG. 10 as well as FIG. 9. Explanation will be given, taking as an example a case where the first and second elements are arsenic and phosphorus, respectively.

FIG. 10 shows a profile of impurity concentration (hereinafter, referred to as impurity concentration profile) of each of arsenic and phosphorus in a junction (stacked unit) composed of the silicide layer 36 and n-type silicon layer 33. In FIG. 10, the abscissa axis (shown by "A" in the figure) corresponds to the depth (unit: nm) of a junction between the silicide layer 36 and n-type silicon layer 33. The ordinate axis (shown by "B" in the figure) corresponds to the impurity concentration (unit: atoms/cm$^{-3}$) of each of phosphorus and arsenic. In FIG. 10, the impurity concentration is shown, starting from the top face of the silicide layer 36 to the bottom face of the n-type silicon layer 33. In FIG. 10, "IF" indicates the interface between the silicide layer 36 and n-type silicon layer 33. The part more negative than "IF" corresponds to the silicide layer 36.

In FIG. 10, solid line C-1 shows an impurity concentration profile of arsenic (As) and broken line C-2 shows an impurity concentration profile of phosphorus (P). Dotted line IF in FIG. 10 corresponds to the interface between the silicide layer 36 and n-type silicon layer 33 in FIG. 9.

As shown in FIG. 10, in the impurity concentration profile of phosphorus C-2 in the depth direction, the impurity concentration of phosphorus at the interface is lower than in the n-type silicon layer (lower in level than the interface IF in the third direction). That is, the impurity concentration profile of phosphorus C-2 has the maximum impurity concentration of phosphorus in the n-type silicon layer 33 lower in level than the interface (surface) IF in the third direction.

The impurity concentration profile of phosphorus C-2 changes more gently from the interface IF toward the bottom face (the lower part in the third direction) of the n-type silicon layer than the impurity concentration profile of arsenic C-1. The profile changing gently shows that the diffusivity of phosphorus in the silicon layer is high and phosphorus has diffused throughout the n-type silicon layer (a large area).

As shown in FIG. 10, in the impurity concentration profile of arsenic C-1 in the depth direction, the impurity concentration of arsenic at the interface IF is higher than that in the n-type silicon layer 33. That is, the impurity concentration profile of arsenic C-1 has the maximum impurity concentration of arsenic near the interface IF.

In addition, the impurity concentration profile of arsenic C-1 changes sharply near the interface between the silicide layer 36 and n-type silicon layer 33. Such a sharp change in the profile shows that arsenic has segregated near the interface.

Since the silicide layer 36 is formed by subjecting the top face of the n-type silicon layer 33 to silicide process, the silicide layer 36 includes arsenic and phosphorus as shown in FIG. 10, similarly to the n-type silicon layer 33.

In a rectifying device using silicon, such as a p-i-n diode, the upper limit of the output current (hereinafter, referred to as the forward current) of a diode to which a forward bias is applied is influenced by electric resistance (hereinafter, referred to as interface resistance) developed at the interface between the silicon layer and silicide layer. When the interface resistance becomes higher, the upper limit of the forward current becomes smaller and the forward current decreases.

The interface resistance $\rho_{IF}$ between the silicon layer and silicide layer is represented by (equation 1):

$$\rho_{IF} \propto \exp(\phi_B/\sqrt{(N_D)}) \quad \text{(equation 1)}$$

In (equation 1), "$\phi_B$" represents the height of a Schottky barrier between silicide and silicon. In (equation 1), "$N_D$" represents the interface impurity concentration of impurities included in silicon at the interface between silicon and silicide.

As shown in (equation 1), the interface resistance $\rho_{IF}$ increases as the interface impurity concentration $N_D$ decreases.

When the n-type silicon layer 33 is formed, since phosphorus tends to diffuse from the surface of the silicon layer 33 to the outside, the impurity concentration of phosphorus at the interface between the silicide layer 33 and n-type silicon layer 33 is lower than the maximum impurity concentration of phosphorus as in the impurity concentration profile of phosphorus C-2.

Accordingly, when the n-type silicon layer 33 is doped with only phosphorus as donor impurities, the interface resistance between the n-type silicon layer 33 and conducting layer (silicide layer) 36 increases.

Therefore, as in an ordinary resistance change memory, when an n-type silicon layer including only phosphorus as donor impurities is used as a non-ohmic element (e.g., p-i-n diode), since the impurity concentration of phosphorus at the interface between the silicon layer 33 and silicide layer 36 is low, the interface resistance increases and the forward current in the diode decreases.

On the other hand, as shown in FIG. 10, the impurity concentration profile of arsenic C-1 has shown that arsenic as a donor-type impurity has the property of segregating at the interface (surface).

Therefore, in the resistance change memory of the embodiment, a segregation layer 39 where arsenic 41 added as donor impurities and phosphorus is segregated at a high concentration is formed near the interface between the silicon layer 33 and silicide layer 36 as shown in FIGS. 9 and 10.

As in the resistance change memory of the embodiment, the n-type silicon layer 33 constituting a non-ohmic element includes arsenic and phosphorus as donor impurities, causing arsenic 41 to segregate at the interface IF even if the impurity concentration of phosphorus 42 at the silicon-silicide interface (surface) IF has decreased. This enables the non-ohmic element 30 constituting the resistance change memory of the embodiment to suppress a decrease in the interface impurity concentration $N_D$ and therefore an increase in the interface resistance $\rho_{IF}$.

Accordingly, in the resistance change memory of the embodiment, the non-ohmic element (p-i-n diode) 30 can supply to the memory element 20 a sufficient forward current to change the resistance value of the resistance change film 21 in the operation of setting or resetting the cell unit.

To suppress an increase in the interface resistance, it is preferable that the impurity concentration of arsenic should be not less than $1\times10^{20}$ atoms/cm$^3$. In addition, of course, the interface resistance can be decreased by increasing the impurity concentration of arsenic.

Here, arsenic has the property of segregating at the interface IF but being less liable to diffuse throughout the silicon layer 33. Therefore, since an n-type silicon layer including only arsenic as donor impurities has a shorter depletion layer width than an impurity concentration profile distributed gently and widely from the top toward bottom of the n-type silicon layer 33, the parasitic capacitance of the cell unit increases.

In contrast, as shown in FIG. 10, in the resistance change memory of the embodiment, the impurity concentration profile of phosphorus is distributed more gently and widely from the top toward bottom of the n-type silicon layer 33 than the impurity concentration of arsenic. As a result, it is possible to prevent increasing the parasitic capacitance of the n-type silicon layer.

Specifically, in the embodiment, since the n-type silicon layer has been doped with phosphorus together with arsenic, even if the diffusivity of arsenic 41 to the n-type silicon layer 33 is low, parasitic capacitance attributable to the depletion of the n-type silicon layer can be decreased by diffusing phosphorus 42 throughout the n-type silicon layer 33. As a result, a delay in the operation of the memory attributable to the depletion of the cell unit is suppressed.

When the n-type silicon layer 33, like a p-i-n diode, is in contact with the i-type silicon layer 32, phosphorus might diffuse as far as the i-type silicon layer 32. Because phosphorus tends to diffuse in the silicon layer. If phosphorus has diffused in the i-type silicon layer 32, the practical film thickness of the i-type silicon layer 32 decreases and the forward bias characteristic and reverse bias characteristic of the p-i-n diode deteriorate. Therefore, to obtain a specific characteristic, the film thickness of the i-type silicon layer 32 is increased, taking the diffusion length of phosphorus into account. The diffusion length of phosphorus in the silicon layer depends on the impurity concentration of phosphorus.

Accordingly, to suppress the depletion of the n-type silicon layer by phosphorus doping and further suppress the diffusion of phosphorus to i-type silicon, it is preferable that the maximum impurity concentration of phosphorus should be not greater than the maximum impurity concentration of arsenic. In addition, it is more preferable that the maximum impurity concentration of phosphorus should be in the range from not less than $1\times10^{19}$ atoms/cm$^3$ to not more than $1\times10^{20}$ atoms/cm$^3$.

As in the resistance change memory of the embodiment, the n-type silicon layer 33 constituting the non-ohmic element 30 includes two types of donor impurities, arsenic and phosphorus, the interface resistance developed at the interface between the conducting layer (e.g., silicide layer) 36 and n-type silicon layer 33 can be decreased and parasitic capacitance attributable to the depletion of the n-type silicon layer 33 can be decreased.

Accordingly, in the resistance change memory of the embodiment, the deterioration of the forward bias characteristic and reverse bias characteristic of the non-ohmic element (e.g., p-i-n diode) 30 included in a cell unit is suppressed.

While in the embodiment, the structure of the non-ohmic element has been explained using a p-i-n diode, even a p-n diode or a MIS diode, of course, produces the aforementioned effects, provided that the non-ohmic element has a structure where the n-type silicon layer 33 and silicide layer 36 (35) form a junction.

As described above, according to the resistance change memory of the embodiment, the deterioration of the element characteristics can be reduced.

(2) Manufacturing Method

A method of manufacturing the resistance change memory of the embodiment will be explained with reference to FIGS. 11A to 11G. In the manufacturing method, although the structure of a cell unit to be formed will be explained, taking as an example a case where a memory element is stacked on a non-ohmic element, the manufacturing method is not limited to such structure.

FIG. 11A shows a cross-section structure of the memory cell array in the second direction in a step of a method of manufacturing the resistance change memory of the embodiment. In the step of FIG. 11A, a cross-section structure of the memory cell array in the first direction is the same as that of FIG. 11A.

As shown in FIG. 11A, a conducting layer 60X serving as an interconnect is deposited on a substrate (e.g., an interlayer insulating film) 11 by, for example, chemical vapor deposition (CVD) techniques or sputtering techniques.

On the conducting layer 60X, a plurality of layers for forming a rectifying device (non-ohmic element) of a cell unit are deposited sequentially by, for example, chemical vapor deposition (CVD) techniques or sputtering techniques. The conducting layer 60X is composed of silicide, metal, or conductive metal compound, or a stacked film of these.

On the conducting layer 60X serving as an interconnect, a conducting layer 35X as the electrode of an element is formed. Silicide or conductive metal compound is used for the conducting layer 35X.

For example, when a non-ohmic element is a p-i-n diode, three semiconductor layers 31X, 32X, 33X are staked on the conducting layer 35X. The semiconductor layers 31X, 32X, 33X are, for example silicon layers. The number of layers constituting a non-ohmic element, such as silicon layers, differs according to the structure shown in FIGS. 8A to 8C.

As shown in FIG. 11A, a p-type silicon layer 31X is deposited on the conducting layer 35X by CVD techniques. For example, the p-type silicon layer 31X is an amorphous silicon layer doped with boron (B) and has a film thickness of about 3 nm to 30 nm. When the p-type silicon layer 31X is deposited, the silicon layer 31X may be doped with boron in situ. Alternatively, the silicon layer 31X may be doped with boron by ion implantation after the silicon layer 31X has been deposited.

An intrinsic silicon layer (i-type silicon layer) 32X is deposited on the p-type silicon layer 31X. The i-type silicon layer 32X is an amorphous silicon layer and has a film thickness of about 60 nm to 120 nm.

An n-type silicon layer 33X is formed on the i-type silicon layer 32X. The n-type silicon layer 33X is an amorphous silicon layer doped with phosphorus (P) at the time of deposition and has a film thickness of about 3 nm to 30 nm.

When the n-type silicon layer 33X is deposited, the silicon layer 31X may be doped with phosphorus in situ. Alternatively, the silicon layer 33X may be doped with phosphorus by ion implantation after the silicon layer 33X has been deposited. The impurity concentration of phosphorus with which the n-type silicon layer 33X has been doped is in the range of, for example, not less than $1\times10^{19}$ atoms/cm$^3$ to not more than $1\times10^{20}$ atoms/cm$^3$. When the impurity concentration of phosphorus is set in this range, the depletion of the n-type silicon layer 33 when a voltage is applied is suppressed and further the diffusion of phosphorus in the i-type silicon layer 32X is suppressed.

After an n-type silicon layer 33X doped with phosphorus has been deposited, the n-type silicon layer 33X is doped with arsenic by, for example, ion implantation. The impurity concentration of arsenic with which the n-type silicon layer 33X has been doped is, for example, not less than $1 \times 10^{20}$ atoms/cm$^3$.

After the n-type silicon layer 33X has been doped with arsenic, the p-type silicon layer 31X, i-type silicon layer 32X, and n-type silicon layer 33X are heat-treated at about 500° C. to 750° C., thereby crystallizing amorphous silicon. In the heating treatment for crystallization, for example, rapid thermal annealing (RTA) techniques are used.

The order in which three layers constituting a p-i-n diode are stacked is changed suitably, depending on which one of the circuit configurations shown by "a" to "p" in FIG. 4 the cell unit has.

Between the two conducting layers 60X, 35X, or between the conducting layer 35X and silicon layer 31X, a diffusion prevention layer, an adhesion layer, and a high-concentration impurity layer (segregation layer) may be formed.

FIG. 11B shows a cross-section structure of the memory cell array in the second direction in a step of the method of manufacturing the resistance change memory of the embodiment.

As shown in FIG. 11B, in a chemical reaction (silicide reaction) of the n-type silicon layer 33X with a metal layer (not shown) by heating, a silicide layer 36X is formed on the n-type silicon layer 33X. A metal layer for forming the silicide layer 36X includes at least one of metal element selected from, for example, titanium (Ti), cobalt (Co), nickel (Ni), iridium (Ir), platinum (Pt), and palladium (Pd). Therefore, the silicide layer 36X formed includes at least one of those metal elements. After the silicide layer 36X has been formed, the metal layers that have not reacted with the silicon layer 33 are removed by, for example, wet etching.

At the interface between the silicide layer 36X and an n-type silicon layer 39, a segregation layer 39X where arsenic has segregated with a high concentration is formed.

After the silicide layer 36X has been formed on the n-type silicon layer 33X, the impurity concentration profile of phosphorus and that of arsenic in the n-type silicon layer 33X are as shown in FIG. 10.

Specifically, arsenic segregates near the interface between the silicide layer 36X and n-type silicon layer 33X. The impurity concentration of arsenic has the maximum value near the interface.

On the other hand, phosphorus diffuses gently throughout the n-type silicon layer 33X. The impurity concentration of phosphorus has the maximum value closer to the bottom of the n-type silicon layer 33X than the interface between the silicide layer 36X and n-type silicon layer 33X. For example, the maximum impurity concentration of phosphorus is equal to or less than the maximum impurity concentration of arsenic.

As a result, even if phosphorus diffuses from the surface of the silicon layer to the outside, a drop in the interface impurity concentration of the n-type silicon layer 33 is prevented since arsenic segregates at the interface between the silicon layer 33 and silicide layer 35.

Figure 11C:
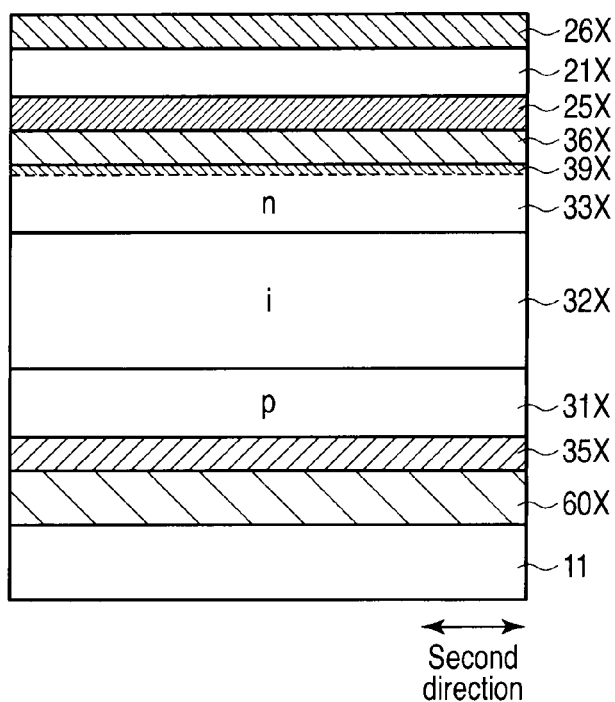
FIG. 11C shows a step of the resistance change memory manufacturing method according to the embodiment.

FIG. 11C shows a cross-section structure of the memory cell array in the second direction in a step of the method of manufacturing the resistance change memory of the embodiment.

As shown in FIG. 11C, a first electrode layer 25X, a resistance change film 21X, and a second electrode layer 26X are stacked as components of the memory element on the silicide layer 39X in that order.

The electrode layers 25X, 26X are formed by, for example, CVD techniques or sputtering techniques. The resistance change film 21X is formed by, for example, sputtering techniques, CVD techniques, atomic layer deposition (ALD) techniques, or metal-organic CVD (MOCVD) techniques.

Materials for the electrode layers 25X, 26X and resistance change film 21X are selected on the basis of a combination of materials which enable the resistance value of the resistance change film 21X to change reversibly and the changed resistance value of the resistance change film 21X to remain unchanged until energy is applied.

If the resistance change film 21X itself is a material whose resistance value is changed reversibly by externally applied energy (e.g., voltage or heat) and which enables the changed resistance value to remain unchanged, materials for the electrode layers 25X, 26X are not limited.

As described above, metal oxide, metal compound, or organic matter is used for the resistance change film 21X.

Between the electrode 25X and silicide layer 36X, a diffusion prevention layer or an adhesion layer may be provided.

Figure 11D:
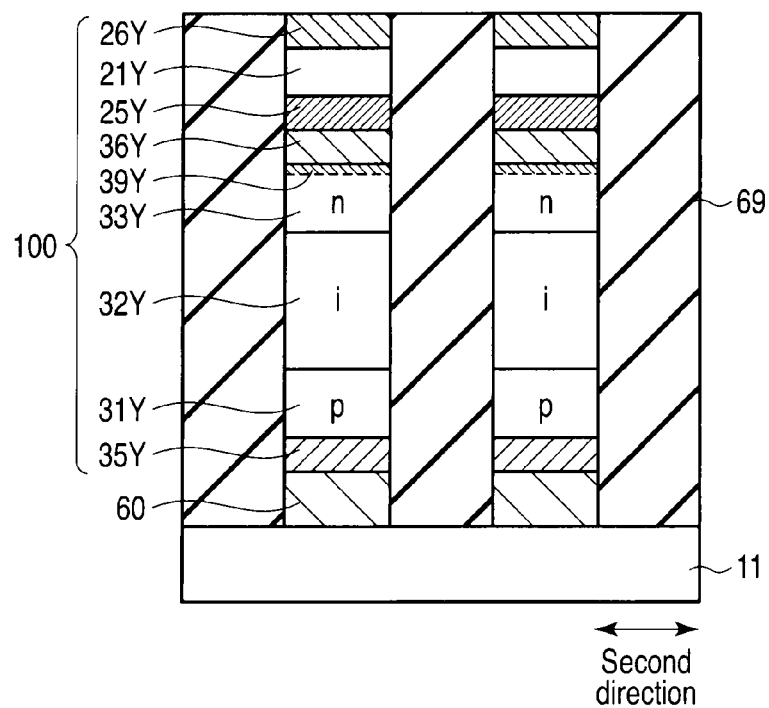
FIG. 11D shows a step of the resistance change memory manufacturing method according to the embodiment.

FIG. 11D shows a cross-section structure of the memory cell array in the second direction in a step of the method of manufacturing the resistance change memory of the embodiment.

As shown in FIG. 11D, a mask of a specific shape (not shown) is formed on the electrode layer 26Y. The mask is made of, for example, tungsten (W).

Then, the individual layers under the mask are processed sequentially by etching using photolithographic techniques and reactive ion etching techniques.

The electrode layers 25Y, 26Y, resistance change film 21Y, conducting layers 35Y, 36Y, and individual silicon layers 31Y, 32Y, 33Y are processed by etching according to the shape of the mask and divided at specific intervals in the second direction on a cell unit basis.

As a result, a stacked unit 100 is formed on the substrate 11. The formed stacked unit 100 extends in the first direction.

The conducting layers are processed at the same time that the stacked unit is formed, thereby forming interconnects 60 extending in the second direction. The interconnects 60 are used as bit lines or word lines.

Thereafter, an interlayer insulating film 69 is buried between adjacent staked units 100 by, for example, CVD techniques or coating techniques.

If the mask is made of metal, the mask may be allowed to remain on the electrode layer 26Y without being exfoliated.

In the step, a first memory cell array M1 shown in FIG. 2 may be formed by dividing the stacked unit 100 in the first direction and forming interconnects extending in the second direction. Here, it is preferable that cell units and memory cell arrays should be formed using the manufacturing steps shown in FIGS. 11E to 11G described below without the step of dividing the stacked unit 100 in the first direction to form cell units (memory cell arrays) immediately after the step shown in FIG. 11D in the cross-point memory cell array.

Figure 11F:
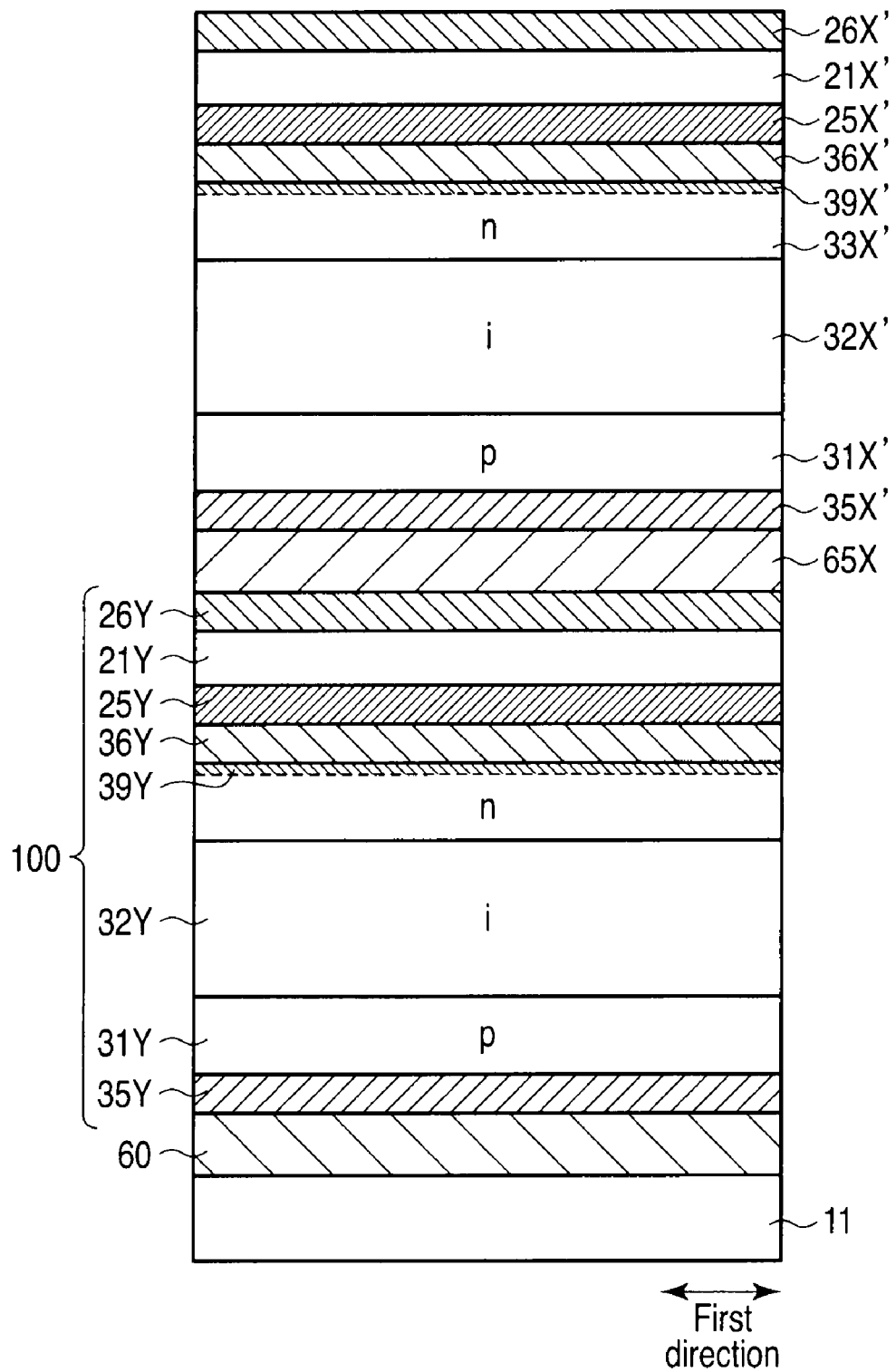
FIG. 11F shows a step of the resistance change memory manufacturing method according to the embodiment.

FIG. 11E shows a cross-section structure of the memory cell array in the second direction in a step of the method of manufacturing the resistance change memory of the embodiment. FIG. 11F shows a cross-section structure of the memory cell array in the first direction in a step of the method of manufacturing the resistance change memory of the embodiment.

As shown in FIGS. 11E and 11F, a conducting layer 65X serving as a second interconnect is deposited on the stacked unit 100 extending in the first direction and interlayer insulating film 69. Then, layers for constituting cell units of a second memory cell array are stacked in sequence on the conducting layer 65.

The order in which the layers to be stacked on the conducting layer 65 differs, depending on which one of the relations of connection shown by "a" to "p" in FIG. 4 the two cell units between which an interconnect (conducting layer 65X) is sandwiched have.

For ease of explanation, the relation of connection shown by "d" in FIG. 4 will be described. In the examples of FIGS. 11E and 11F, the order in which the layers 35X', 31X', 32X', 33X', 36X', 25X', 21X', 26X' are stacked on the conducting layer 65X is the same as the order in which the layers constituting the stacked unit 100 are stacked. The individual layers stacked on the conducting layer 65X are formed in the same manufacturing steps as the layers constituting the stacked unit 100.

FIG. 11G shows a cross-section structure of the memory cell array in the first direction in a step of the method of manufacturing the resistance change memory of the embodiment.

The layers 26X', 21X', 25X', 36X', 33X', 32X', 31X', 35X', 65X and the underlying stacked unit 100 on the interconnect 60 are processed by photolithographic techniques and RIE techniques, while an etching selected ratio for the interconnect 60 is being secured.

As a result, each of the layers 26X', 21X', 25X', 36X', 33X', 32X', 31X', 35X', 65X is divided in the first direction. The stacked unit 100 extending in the first direction under those layers is divided at specific intervals in the first direction on a cell unit basis.

Accordingly, as shown in FIG. 11G, interconnects 65 extending in the second direction are formed and a cell unit CU1 is formed between an interconnect 60 extending in the first direction and an interconnect 65 extending in the second direction. One of the first and second interconnects 60, 65 is used as a bit line and the other is used as a word line.

In the cell unit CU1, the non-ohmic element (e.g., p-i-n diode) 30 includes arsenic and phosphorus as donor impurities in the n-type silicon layer 33 constituting the element. Between the silicide layer 36 and n-type silicon layer 33, an arsenic segregation layer 39 is formed. On the conducting layer 36 at the top of the non-ohmic element 30, a memory element 20 of the cell unit CU1 is formed.

Since etching is done, starting with the top layer sequentially, a stacked unit 100' is formed above the cell unit CU1 with the interconnect 65 between the member 100' and unit CU1. Like the interconnect 65, the stacked unit 100' is divided in the first direction.

In the step shown in FIG. 11G, the cross-section structure of the cell unit CU1 in the second direction is the same as that shown in FIG. 11D. That is, the stacked unit 100' extends in the second direction. In the cross-point memory cell array, the stacked unit 100' is processed in the second direction, thereby producing a cell unit CU2 of a memory cell array M2 in a higher layer (a second layer) than the memory cell array in the first layer.

An interlayer insulating film is buried between adjacent cell units CU1 in the first direction and between adjacent stacked units 100' in the first direction.

When a memory cell array is further provided on the stacked unit 100', the same steps as those shown in FIGS. 11E to 11G are carried out repeatedly until the number of stacked layers of memory cell arrays has reached a specific number.

The heating treatment for crystallizing amorphous silicon into polysilicon may be performed only once after a specific number of stacked layers of memory cell arrays have been formed, without performing the heating treatment layer by layer (or memory cell array by memory cell array).

As shown in FIGS. 11E to 11G, the memory cell array in the first layer and that in the second layer are processed at the same time on the substrate 11.

As described above, the process of forming the upper memory cell array and the process of forming the lower memory cell array are standardized, making simpler the steps of manufacturing the resistance change memory including the cross-point memory cell arrays than the steps of processing the memory cell array in each layer (each interconnect level) in the first and second directions, which reduces the manufacturing cost.

In the step shown in FIG. 11B, the metal layers that have not silicide-reacted with the silicon layer may be used as a first electrode layer of the memory element without being removed. For example, as shown in FIG. 11H, as a result of the silicide reaction of the n-type silicon layer 33 with a metal layer 25XX, a silicide layer 36X is formed on the n-type silicon layer 33X. Thereafter, the metal layer 25XX that has not silicide-reacted with the silicon layer is not removed. On the metal layer 25XX, the resistance change film 21X and second electrode layer 26X are deposited sequentially as components of the memory element as shown in FIG. 11C. As a result, the metal layer 25XX can be used as a first electrode layer, which simplifies the resistance change memory manufacturing steps.

By the above steps, a resistance change memory of the embodiment is completed.

In the resistance change memory manufacturing method of the embodiment, the n-type silicon layer 33 included in the non-ohmic element (e.g., p-i-n diode) 30 is doped with arsenic and phosphorus as donor impurities. A conducting layer 36 is formed between the non-ohmic element 30 and memory element 20 constituting the cell unit CU1, with an interface developing between the n-type silicon layer 33 and conducting layer 36.

In the resistance change memory manufacturing method of the embodiment, an arsenic segregation layer 39 is formed at the interface between the n-type silicon layer 33 and conducting layer (silicide layer) 36, which enables a decrease in the interface impurity concentration of the n-type silicon layer 33 to be suppressed and further the interface impurity concentration of the n-type silicon layer 33 to be increased.

Therefore, by the manufacturing method shown in FIGS. 11A to 11D, a non-ohmic element 30 where the interface resistance between the n-type silicon layer 33 and silicide layer 36 is low is formed.

Therefore, according to the resistance change memory manufacturing method of the embodiment, a non-ohmic element (e.g., p-i-n diode) 30 capable of outputting a large forward current to a memory element can be formed.

Furthermore, in a place closer to the bottom of the n-type silicon layer 33 (in the lower part in the third direction) than the interface between the n-type silicon layer 33 and silicide layer 36, the n-type silicon layer 33 constituting the non-ohmic element 30 has a gentler impurity concentration profile of phosphorus in the silicon layer 33 than the impurity concentration profile of arsenic. Therefore, the silicon layer is less liable to be depleted.

Therefore, according to the resistance change memory manufacturing method of the embodiment, a non-ohmic element capable of suppressing an increase in the parasitic capacitance of a cell unit can be formed. As a result, an operating delay attributable to the parasitic capacitance of the cell unit is suppressed.

Consequently, according to the resistance change memory manufacturing method of the embodiment, it is possible to provide a resistance change memory which suppresses the deterioration of the element characteristics.

(3) Operation

The operation of the resistance change memory of the embodiment will be explained with reference to FIG. 12.

Figure 12:
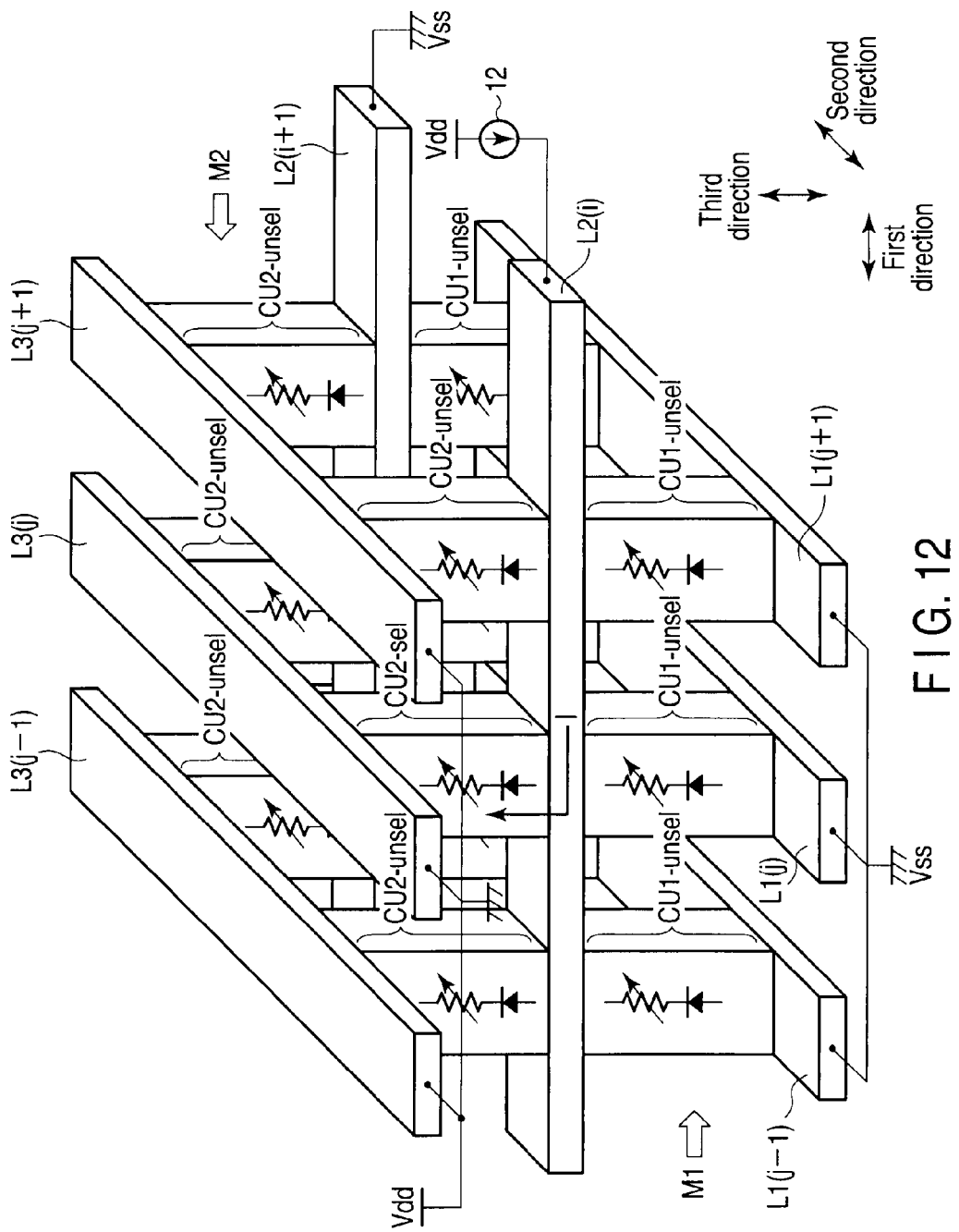
FIG. 12 is a diagram to explain the operation of the resistance change memory according to the embodiment.

FIG. 12 shows two memory cell arrays.

Memory cell array M1 corresponds to memory cell array M1 of FIG. 2 and memory cell array M2 corresponds to memory cell array M2 of FIG. 2. The relation of connection between a memory element and a non-ohmic element (e.g., rectifying device) in each of cell units CU1, CU2 corresponds to "d" in FIG. 4.

A. Set Operation

First, a case where the selected cell unit CU2-sel in memory cell array M2 is written into (or set) will be explained.

The initial state of the selected cell unit CU2-sel is an erased (reset) state.

For example, suppose the reset state is a high-resistance state (100 kΩ to 1 MΩ) and the set state is a low-resistance state (1 kΩ to 10 kΩ).

The selected interconnect L2($i$) is connected to a power supply potential Vdd on the high potential side and the selected interconnect L3($j$) is connected to a power supply potential Vss on the low potential side.

Of the third interconnects from the substrate, the remaining unselected interconnects L3($j$−1), L3($j$+1) excluding the selected interconnect L3($j$) are connected to the power supply potential Vdd. Of the second interconnects from the substrate, the remaining unselected interconnect L2($i$+1) excluding the selected interconnect L2($i$) is connected to the power supply potential Vss.

In addition, the first unselected interconnects L1($j$−1), L1($j$), L1($j$+1) from the substrate are connected to the power supply potential Vss.

At this time, a forward bias is applied to the non-ohmic element (e.g., p-i-n diode) in the selected cell unit CU2-sel. As a result, set current I-set from a constant current source 12 flows in the selected cell unit CU2-sel. The resistance value of the memory element in the selected cell unit CU2-sel changes from the high-resistance state to the low-resistance state.

In a set operation, for example, a voltage of 3 V to 6 V is applied to the memory element in the selected cell unit CU2-sel during a period (pulse width) of about 10 ns to 100 ns. The current value of set current I-set caused to flow in the memory element (in the high-resistance state) is, for example, about 10 nA and its current density is set in the range of $1\times10^5$ to $1\times10^7$ A/cm².

On the other hand, of the unselected cell units CU2-unsel in memory cell array M2, a reverse bias is applied to the non-ohmic element (p-i-n diode) in the cell unit connected between the unselected interconnects L3($j$−1), L3($j$+1) and the unselected interconnect L2($i$+1).

Similarly, of the unselected cell units CU1-unsel in memory cell array M1, a reverse bias is applied to the non-ohmic element (p-i-n diode) in the cell unit connected between the selected interconnect L2($i$) and the unselected interconnects L1($j$−1), L1($j$), L1($j$+1).

The potential difference between the terminals of the non-ohmic element (p-i-n diode) in the cell unit connected between the selected interconnect L2($i$) and the unselected interconnects L3($j$−1), L3($j$+1) is made practically zero (Vdd−Vdd). Similarly, the potential difference between the terminals of the non-ohmic element (p-i-n diode) in the cell unit connected between the selected interconnect L3($i$) and the unselected interconnect L2($i$+1) is made practically zero (Vss−Vss).

B. Reset Operation

Next, a case where the selected cell unit CU2-sel in memory cell array M1 is erased will be explained.

The selected interconnect L2($i$) is connected to the power supply potential Vdd on the high potential side and the selected interconnect L3($j$) is connected to the power supply potential Vss on the low potential side.

Of the third interconnects from the substrate, the remaining unselected interconnects L3($j$−1), L3($j$+1) excluding the selected interconnect L3($j$) are connected to the power supply potential Vdd. Of the second interconnects from the substrate, the unselected interconnect L2($i$+1) excluding the selected interconnect L2($i$) is connected to the power supply potential Vss.

In addition, the first unselected interconnects L1($j$−1), L1($j$), L1($j$+1) from the substrate are connected to the power supply potential Vss.

At this time, a forward bias is applied to the non-ohmic element (e.g., p-i-n diode) in the selected cell unit CU2-sel. As a result, reset current I-reset from the constant current source 12 flows in the selected cell unit CU2-sel. The resistance value of the memory element in the selected cell unit CU2-sel changes from the low-resistance state to the high-resistance state.

In a reset operation, a voltage of 0.5 V to 3 V is applied to the memory element in the selected cell unit CU1-sel during a period (pulse width) of about 200 ns to 1 μs. The current value of the reset current I-reset caused to flow in the memory element (in the low-resistance state) is about 1 μA to 100 μA and its current density is set in the range of $1\times10^3$ to $1\times10^6$ A/cm².

On the other hand, of the unselected cell units CU2-unsel in memory cell array M2, a reverse bias is applied to the non-ohmic element (p-i-n diode) in the cell unit connected between the unselected interconnects L3($j$−1), L3($j$+1) and the unselected interconnect L2($i$+1).

Similarly, of the unselected cell units CU1-unsel in memory cell array M1, a reverse bias is applied to the rectifying device (diode) in the cell unit connected between the selected interconnect L2($i$) and the unselected interconnects L1($j$−1), L1($j$), L1($j$+1).

The potential difference between the terminals of the non-ohmic element (p-i-n diode) in the cell unit connected between the selected interconnect L2($i$) and the unselected interconnects L3($j$−1), L3($j$+1) is made practically zero (Vdd−Vdd). Similarly, the potential difference between the terminals of the non-ohmic element (p-i-n diode) in the cell unit connected between the selected interconnect L3($j$) and the unselected interconnect L2($i$+1) is made practically zero (Vss−Vss).

The current value of set current I-set and the current value of reset current I-reset differ from each other. When a set operation and a reset operation of the memory element depend on the pulse width of each of current and voltage, the pulse width of the set current and the pulse width of the reset current differ from each other. The value and period (pulse width) of a voltage applied to the memory element in the selected sell unit CU1-sel depend on the material constituting the memory element.

C. Read Operation

Next, a case where the selected cell unit CU2-sel in the memory cell array M2 is read from will be explained.

The selected interconnect L2($i$) is connected to the power supply potential Vdd on the high potential side and the selected interconnect L3($j$) is connected to the power supply potential Vss on the low potential side.

Of the third interconnects from the substrate, the remaining unselected interconnects L3($j$−1), L3($j$+1) excluding the selected interconnect L3($j$) are connected to the power supply potential Vdd. Of the second interconnects from the substrate, the remaining unselected interconnect L2($i$+1) excluding the selected interconnect L2($i$) is connected to the power supply potential Vss.

In addition, the first unselected interconnects L1($j$−1), L1($j$), L1($j$+1) from the substrate are connected to the power supply potential Vss.

At this time, a forward bias is applied to the non-ohmic element (e.g., p-i-n diode) in the selected cell unit CU2-sel. As a result, read current I-read from the constant current source 12 flows in the memory element (in the high-resistance state or low-resistance state) in the selected cell unit CU2-sel.

Accordingly, for example, the data (resistance value) in the memory element can be read by detecting a change in the potential at a sense node when read current I-read is flowing in the memory element.

The value of read current I-read must be sufficiently smaller than the value of set current I-set and the value of reset current I-reset so that the resistance value of the memory element may not change in a read operation. When a change in the resistance value of the memory element depends on the current pulse width, the pulse width of the read current is set to a value that prevents the resistance value of the memory element from changing.

As in a set and a reset operation, in a read operation, of the unselected cell units CU2-unsel in memory cell array M2, a reverse bias is applied to the rectifying device (p-i-n diode) in the cell unit connected between the unselected interconnects L3($j$−1), L3($j$+1) and the unselected interconnect L2($i$+1).

In addition, of the unselected cell units CU1-unsel in memory cell array M1, a reverse bias is applied to the non-ohmic element (p-i-n diode) in the cell unit connected between the selected interconnect L2($i$) and the unselected interconnects L1($j$−1), L1($j$), L1($j$+1).

The potential difference between the terminals of the non-ohmic element (p-i-n diode) in the cell unit connected between the selected interconnect L2($i$) and the unselected interconnects L3($j$−1), L3($j$+1) is made practically zero (Vdd−Vdd). Similarly, the potential difference between the terminals of the non-ohmic element (p-i-n diode) in the cell unit connected between the selected interconnect L3($j$) and the unselected interconnect L2($i$+1) is made practically zero (Vss−Vss).

As described above, the set, reset, and read operations of the resistance change memory are performed.

The non-ohmic element, such as a p-i-n diode, in the cell unit flows not only a large current when a forward bias is applied but also flows sufficiently small current and has a sufficiently high breakdown voltage when a reverse bias is applied.

In the resistance change memory of the embodiment, the cell unit CU is including the memory element 20 and non-ohmic element 30. The memory element 20 is connected to the non-ohmic element 30 via the conducting layer (e.g., silicide layer) 36 provided at one end of the non-ohmic element as shown in FIG. 7.

As shown in FIG. 9, the non-ohmic element 30 of the cell unit CU has the n-type silicon layer 33. The n-type silicon layer 33 includes arsenic (As) 41 and phosphorus (P) 42 as donor impurities.

The conducting layer (e.g., silicide layer) 36 is provided on the n-type silicon layer 33. Between the n-type silicon layer 33 and conducting layer 36, an interface is formed.

Since phosphorus tends to diffuse from the silicon surface to the outside, the impurity concentration of phosphorus at the interface IF between the silicon layer 33 and silicide layer 36 is lower than that of phosphorus in the silicon layer 33.

However, as arsenic 41 with which the n-type silicon layer 33 has been doped together with phosphorus 42 has the property of segregating at the interface between the silicon layer 33 and silicide layer 36. As a result, the impurity concentration of arsenic at the interface IF between the silicon layer 33 and silicide layer 36 is higher than that of phosphorus.

Therefore, in the embodiment, the interface impurity concentration of the n-type silicon layer 33 does not decrease, an increase in the interface resistance between the silicide layer 36 and n-type silicon layer 33 can be suppressed, and further the interface resistance can be decreased if the interface impurity concentration is sufficiently high.

As a result, the non-ohmic element 30 used in the resistance change memory of the embodiment can increase the upper limit of a forward current when a forward bias is applied and therefore a forward current in the non-ohmic element 30 can be increased. Accordingly, the non-ohmic element 30 used in the resistance change memory of the embodiment can supply to the memory element 20 a forward current large enough to change the resistance value of the memory element 20 when the cell unit is operating.

Furthermore, as shown in FIG. 10, since phosphorus diffuses according to a gentler impurity concentration profile near the interface and in the n-type silicon layer 33 than arsenic does, even if arsenic segregates at the interface, the n-type silicon layer 33 will not be depleted. Accordingly, in the resistance change memory of the embodiment, an increase in the parasitic capacitance of the cell unit can be suppressed and a delay in the operation attributable to the parasitic capacitance is suppressed.

Therefore, according to the resistance change memory of the embodiment, the deterioration of the element characteristics can be suppressed.

Supplementary Example

A supplementary example of the resistance change memory of the embodiment will be described with reference to FIG. 13.

As described above, the vertical position relation between the n-type silicon layer and p-type silicon layer in a p-i-n diode changes according to the relation of connection between the memory element and the non-ohmic element (p-i-n diode).

Therefore, as shown in FIG. 13, the n-type silicon layer 33 might be provided below the p-type silicon layer 31 (on the conducting layer 35 side of FIG. 9), contrary to the example of FIG. 9.

In this case, the i-type silicon layer 32 is stacked on the n-type silicon layer 33, the interface IF2 is formed between the top face of the n-type silicon layer and the bottom face of the i-type silicon layer.

Phosphorus 42 included in the n-type silicon layer 33 diffuses to the outside at the top face of the n-type silicon layer 33. Accordingly, the impurity concentration of phosphorus 42 included in the n-type silicon layer decreases at the interface IF2 between the n-type silicon layer 33 and i-type silicon layer 32.

The junction between the n-type silicon layer 33 and i-type (or p-type) silicon layer 32 is a semiconductor-semiconductor junction. That is, a decrease in the interface impurity concentration at the top face of the n-type silicon layer 33 and an increase in the interface resistance caused by the decrease in the interface impurity concentration do not have a significant effect on the characteristic of the non-ohmic element (e.g., forward current) as compared with the junction between the n-type silicon layer 33 and silicide layer 35.

Here, an interface is formed between the bottom of the n-type silicon layer 33 and the top face of the lower conducting layer 35. Since the interface is the junction between silicon and metal (metal compound) or silicide, it is preferable that the interface resistance should be low.

Therefore, even when the n-type silicon layer 33 is provided below the i-type silicon layer 32, the addition of arsenic 41 together with phosphorus 42 as donor impurities to the n-type silicon layer 33 is effective. Because arsenic 41 is segregated at the interface between the bottom of the n-type silicon layer 33 and the lower conducting layer 35 to decrease the interface resistance between the n-type silicon layer 33 and the lower conducting layer 35.

Furthermore, in this supplementary example, the n-type silicon layer 33 is provided below the i-type silicon layer 32. It is effective that the addition of arsenic 41 to the top face 39 of the n-type silicon layer 32 against the occurrence of the depletion of the silicon layer 32 at the top face 39 of the n-type silicon layer 33 resulting from the external diffusion of phosphorus 42 in the resistance change memory.

Accordingly, even when an interface is formed between the bottom of the n-type silicon layer 33 and the conducting layer 35, the deterioration of the element characteristics of the resistance change memory can be suppressed by adding arsenic 41 and phosphorus 42 as donor impurities to the n-type silicon layer.

[Other]

In the embodiment, a semiconductor layer including two types of donor impurities has been described, taking a silicon layer as an example.

In the embodiment, a semiconductor layer which is used in a non-ohmic element and includes two or more types of donor impurities may be a material other than silicon. That is, the embodiment may be applied to a non-ohmic element which is composed of a semiconductor layer including impurities which tend to segregate at the interface, such as arsenic, and impurities which tend to diffuse internally and externally, such as phosphorus.

Furthermore, the embodiment may be applied not only to a non-ohmic element but also other devices including an n-type silicon layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a first interconnect extending in a first direction;
   a second interconnect extending in a second direction intersecting with the first direction; and
   a cell unit which is provided between the first interconnect and the second interconnect and which comprises
      a non-ohmic element which includes a first silicon layer of an n-conductivity type and a second silicon layer of an intrinsic type in contact with a first face of the first silicon layer, and
      a memory element which stores data according to a reversible change of a resistance state,
   wherein the first silicon layer includes arsenic as a first donor element and phosphorus as a second donor element.

2. The resistance change memory according to claim 1, wherein the first donor element has the maximum value of an impurity concentration at the interface between the first silicon layer and the second silicon layer, and
   the second donor element has the maximum value of an impurity concentration closer to the bottom of the first silicon layer than the interface between the first silicon layer and the second silicon layer.

3. The resistance change memory according to claim 1, wherein the first silicon layer has a high-concentration arsenic layer directly contacting to a conducting layer in a second face opposite to the first face.

4. A resistance change memory comprising:
   a first interconnect extending in a first direction;
   a second interconnect extending in a second direction intersecting with the first direction; and
   a cell unit which is provided between the first interconnect and the second interconnect and which comprises
      a non-ohmic element which includes a first silicon layer of an n-conductivity type and a conducting layer in contact with a first face of the first silicon layer, and
      a memory element which stores data according to a reversible change of a resistance state,
   wherein the first silicon layer includes arsenic as a first donor element and phosphorus as a second donor element.

5. The resistance change memory according to claim 4, wherein the impurity concentration of the first donor element in the first silicon layer is not less than $1 \times 10^{20}$ atoms/cm$^3$ and the impurity concentration of the second donor element is not more than $1 \times 10^{20}$ atoms/cm$^3$.

6. The resistance change memory according to claim 4, wherein the first donor element has the maximum value of the impurity concentration at the interface between the first silicon layer and the conducting layer.

7. The resistance change memory according to claim 4, wherein the second donor element has the maximum value of the impurity concentration closer to a second face of the first silicon layer facing the first face than the interface between the first silicon layer and the conducting layer.

8. The resistance change memory according to claim 4, wherein the non-ohmic element includes a second silicon layer of a p-conductivity type provided on a second face of the first silicon layer facing the first face and a third silicon layer of an intrinsic type provided between the first silicon layer and the second silicon layer.

9. The resistance change memory according to claim 8, wherein the third silicon layer is provided on the second silicon layer,
   a second face of the first silicon layer facing the first face is contacting to the third silicon layer, and the conducting layer is contacting to the first face of the first silicon layer.

10. The resistance change memory according to claim 8, wherein the first face of the first silicon layer is contacting to the conducting layer,
the third silicon layer is contacting to a second face of the first silicon layer facing the first face, and
the second silicon layer is provided on the third silicon layer.

11. The resistance change memory according to claim 4, wherein the conducting layer is a silicide layer which includes at least one element selected from a group of titanium, cobalt, nickel, iridium, platinum, and palladium.

12. The resistance change memory according to claim 4, wherein the memory element is provided above the non-ohmic element via the conducting layer.

13. The resistance change memory according to claim 4, wherein the first silicon layer has a high-concentration arsenic layer directly contacting to the conducting layer in the first face.

* * * * *